(12) United States Patent
Yamada

(10) Patent No.: US 7,735,708 B2
(45) Date of Patent: Jun. 15, 2010

(54) REFLOW FURNACE

(75) Inventor: Osamu Yamada, Hachioji (JP)

(73) Assignee: Yokota Technica Limited Company, Tokyo (JP)

( * ) Notice: Subject to any disclaimer, the term of this patent is extended or adjusted under 35 U.S.C. 154(b) by 115 days.

(21) Appl. No.: 11/778,842

(22) Filed: Jul. 17, 2007

(65) Prior Publication Data

US 2007/0284417 A1 Dec. 13, 2007

Related U.S. Application Data

(63) Continuation of application No. PCT/JP2006/300913, filed on Jan. 16, 2006.

(30) Foreign Application Priority Data

| Jan. 17, 2005 | (JP) | ............................ 2005-008841 |
| Jan. 17, 2005 | (JP) | ............................ 2005-009054 |
| Apr. 28, 2005 | (JP) | ............................ 2005-131549 |
| Apr. 28, 2005 | (JP) | ............................ 2005-132204 |

(51) Int. Cl.
*B23K 37/00* (2006.01)

(52) U.S. Cl. .......................................... 228/42; 228/43

(58) Field of Classification Search ...................... None
See application file for complete search history.

(56) References Cited

U.S. PATENT DOCUMENTS

| 3,337,317 | A | * | 8/1967 | Ritter, Jr. ...................... 65/25.2 |
| 5,039,841 | A | * | 8/1991 | Kato et al. .................... 219/388 |
| 5,044,944 | A | * | 9/1991 | Furuya et al. ................ 432/128 |
| 5,193,735 | A | * | 3/1993 | Knight ........................... 228/42 |
| 5,232,145 | A | * | 8/1993 | Alley et al. .................... 228/102 |
| 5,345,061 | A | * | 9/1994 | Chanasyk et al. ............. 219/388 |
| 5,573,688 | A | * | 11/1996 | Chanasyk et al. ............ 219/388 |

(Continued)

FOREIGN PATENT DOCUMENTS

JP 02-137691 5/1990

(Continued)

OTHER PUBLICATIONS

Notification of Transmittal of Copies of Translation of the International Preliminary Report on Patentability, mailed April 17, 2008; International Preliminary Report on Patentability and English translation of the Written Opinion of the International Searching Authority for corresponding International Patent Application No. PCT/JP2006/300913.

*Primary Examiner*—Kiley Stoner
(74) *Attorney, Agent, or Firm*—Kilyk & Bowersox, P.L.L.C.

(57) ABSTRACT

In a second horizontal plate (18a) bottoming an atmosphere recovery box (18), there are formed circular holes (21) between blowout pipes (20) adjacent to each other. Each of partition walls (2) positioned above a conveyor (5) includes an upper portion formed from a heat-insulating wall (2a) including a heat-insulative material having a thickness of T, and a lower portion formed from a metallic-plate wall (2b) extending downward from the heat-insulating wall (2a) toward the conveyor (5). The pitch P2 of the blowout pipes (20) across the metallic-plate wall (2b) is substantially same as the pitch P1 (12 mm) of the blowout pipes (20) disposed inside each of the chambers (R1 to R5) and adjacent to each other.

8 Claims, 21 Drawing Sheets

U.S. PATENT DOCUMENTS

| | | | | |
|---|---|---|---|---|
| 5,579,981 | A * | 12/1996 | Matsumura et al. | 228/19 |
| 5,897,309 | A * | 4/1999 | Katz et al. | 432/77 |
| 6,106,281 | A * | 8/2000 | Materna | 432/198 |
| 6,146,448 | A * | 11/2000 | Shaw et al. | 95/287 |
| 6,168,064 | B1 * | 1/2001 | Berkin | 228/9 |
| 6,354,481 | B1 * | 3/2002 | Rich et al. | 228/19 |
| 6,437,289 | B1 * | 8/2002 | Yokota | 219/388 |
| 6,780,225 | B2 * | 8/2004 | Shaw et al. | 95/273 |
| 6,936,793 | B1 * | 8/2005 | Shiloh et al. | 219/400 |
| 2002/0073574 | A1 * | 6/2002 | Durdag | 34/201 |
| 2002/0146657 | A1 * | 10/2002 | Anderson et al. | 432/11 |
| 2003/0218058 | A1 * | 11/2003 | Shaw et al. | 228/230 |
| 2007/0045382 | A1 * | 3/2007 | Shibamura et al. | 228/42 |

FOREIGN PATENT DOCUMENTS

| | | |
|---|---|---|
| JP | 2002-043733 | 2/2002 |
| WO | WO 2005/065876 A1 * | 7/2005 |

\* cited by examiner

Conveying direction

Conveying direction

REFLOW FURNACE

The present application is a continuation of International Patent Application No. PCT/JP2006/300913, filed Jan. 16, 2006, which in turn claims priority from Japanese Patent Application No. JP2005-008841, filed Jan. 17, 2005; Japanese Patent Application No. JP2005-009054, filed Jan. 17, 2005; Japanese Patent Application No. JP2005-131549, filed Apr. 28, 2005; and Japanese Patent Application No. JP2005-132204, filed Apr. 28, 2005.

BACKGROUND OF THE INVENTION

1. Field of the Invention

The present invention relates to a reflow furnace in which a printed circuit board with solder paste or solder cream put thereon and having electronic components put in position on the solder cream is heated and cooled to join the electronic components to the circuit board.

2. Related Background Art

In the reflow furnace, a printed circuit board having electronic components in position thereon is heated while it is transported by a conveyor to melt solder cream on the circuit board and join the electronic components to the circuit board. In general, the reflow furnaces can be classified into two major types: air reflow furnaces using air as atmosphere and nitrogen reflow furnaces supplied with gaseous nitrogen as an inert gas to increase the nitrogen content in its atmosphere. However, both types of reflow furnaces basically have a common configuration.

Generally, the reflow furnace has the inner space thereof divided into a plurality of chambers by a plurality of partition walls located at intervals in the direction of transporting a printed circuit board. These chambers are controllable in temperature and flow rate of atmosphere in the furnace independently from each other. Typically, the chambers are used as preheating chambers for preheating the circuit board, heating chambers for melting solder cream present on the circuit board, etc.

Japanese Laid-open Patent Publication JP 2002-134905 discloses a reflow furnace including a plurality of chambers separated from each other and in which in-furnace atmosphere is circulated and blown vertically onto a printed circuit board. For example, hot air is blown onto a printed circuit board in the preheating and heating chambers and, in case of a reflow furnace having a cooling chamber next to a heating chamber, unheated atmosphere is blown onto the printed circuit board in the cooling chamber to cool it.

In the conventional reflow furnaces, increased flow rate of atmosphere blown vertically onto a printed circuit board in each chamber often moves electronic components from their proper positions on the circuit board.

FIG. 20 graphically illustrates measured velocity of atmosphere in a conventional reflow furnace. In FIG. 20, the line A indicates the velocity of atmosphere blown vertically onto a printed circuit board (vertical blow), and the line B indicates the velocity of atmosphere laterally blown on electronic components to the circuit board (horizontal blow). In FIG. 20, reference numeral 100 indicates an inlet wall having formed the inlet of the reflow furnace, 101 indicates partition walls between adjacent chambers, and 102 indicates an outlet wall having formed the outlet of the reflow furnace.

To obtain the data shown in FIG. 20, vertical walls 105 were placed to partition the portion of the circuit board 4a from its front and back in its transport (or conveying) direction as shown in FIG. 21A, and an anemometer S was placed on the circuit board 4a to detect the velocity of the vertical blow. To detect the horizontal blow, a cover 106 in the shape of a rectangular bracket was placed at a height of 3 mm from the circuit board 4a to orient its lateral projections across the transport direction of the circuit board 4a, and the anemometer S was placed on the circuit board 4a under the cover 106, as shown in FIG. 21B. The anemometer S used in the experiments had the following specification, and the reflow furnace was driven at 60 Hz.

(1) Manufacturer of the anemometer S Japan CANOMAX Co., Ltd.
(2) Type of the anemometer S Linear output type ANEMO-MASTER Model 6141
(3) Sensitive portion of the Probe Platinum wire-wound resistor
(4) Response speed Slow As will be seen from the measured data shown in FIG. 20, the velocity of the horizontal blow varied largely near the inlet wall 100, partition walls 101 and outlet wall 102, and the variation in velocity of the horizontal blow was about 2.0 m/sec.

SUMMARY OF THE INVENTION

Inferring that electronic components on a printed circuit board move from proper positions mainly with a horizontal blow, the Inventors of the present invention made researches for solution of the above problem, and through the finding that velocity variation of the horizontal blow, if under 1.5 m/sec, is less likely to displace the electronic components on the circuit board, the Inventors worked out the present invention.

It is therefore an object of the present invention to overcome the above-mentioned drawbacks of the related art by providing a reflow furnace which minimizes influence of horizontal blow and can solder electronic components in position on a printed circuit board.

It is another object to provide a reflow furnace using nitrogen atmosphere, which can reduce the quantity of nitrogen gas required.

According to the first aspect of the invention, those objects can be attained by providing a reflow furnace in which a printed circuit board applied with solder cream and having electronic components put in position on the solder cream is heated to join the electronic components to the circuit board, comprising:

a plurality of chambers separated by dividing the inner space of the furnace by partition walls located at intervals in the transport direction of the circuit board; and an atmosphere circulating mechanism to blow an atmosphere vertically onto the circuit board passing through the chamber while circulating the atmosphere in the chamber, wherein the force of the atmosphere blown vertically onto the circuit board in a region near the partition wall of each chamber is smaller than that of the atmosphere blown vertically onto the circuit board in a central region of the chamber, located along the direction of transporting the circuit board.

According to the second aspect of the invention, those objects of the invention can be attained by providing a reflow furnace in which a printed circuit board applied with solder cream and having electronic components put in position on the solder cream is heated to join the electronic components to the circuit board, comprising:

a plurality of chambers separated from each other by dividing the inner space of the furnace by partition walls located at intervals in the transport direction of the circuit board; and an atmosphere circulating mechanism including a plurality of atmosphere blowout holes to blow an atmosphere vertically onto the circuit board passing through the chamber while circulating the atmosphere in the chamber, wherein the pitch between the atmosphere blowout holes adjacent to each other across the partition wall is substantially equal to that between the atmosphere blowout holes inside each chamber.

BRIEF DESCRIPTION OF THE DRAWINGS

FIG. 21A and FIG. 21B are diagram for explaining ways of measurement used for obtaining the values shown in FIG. 20, in which FIG. 21A is the way for the vertical blow and FIG. 21B is for the horizontal blow.

DETAILED DESCRIPTION OF THE INVENTION

First Embodiment (FIGS. 1 to 5)

Figure 1:
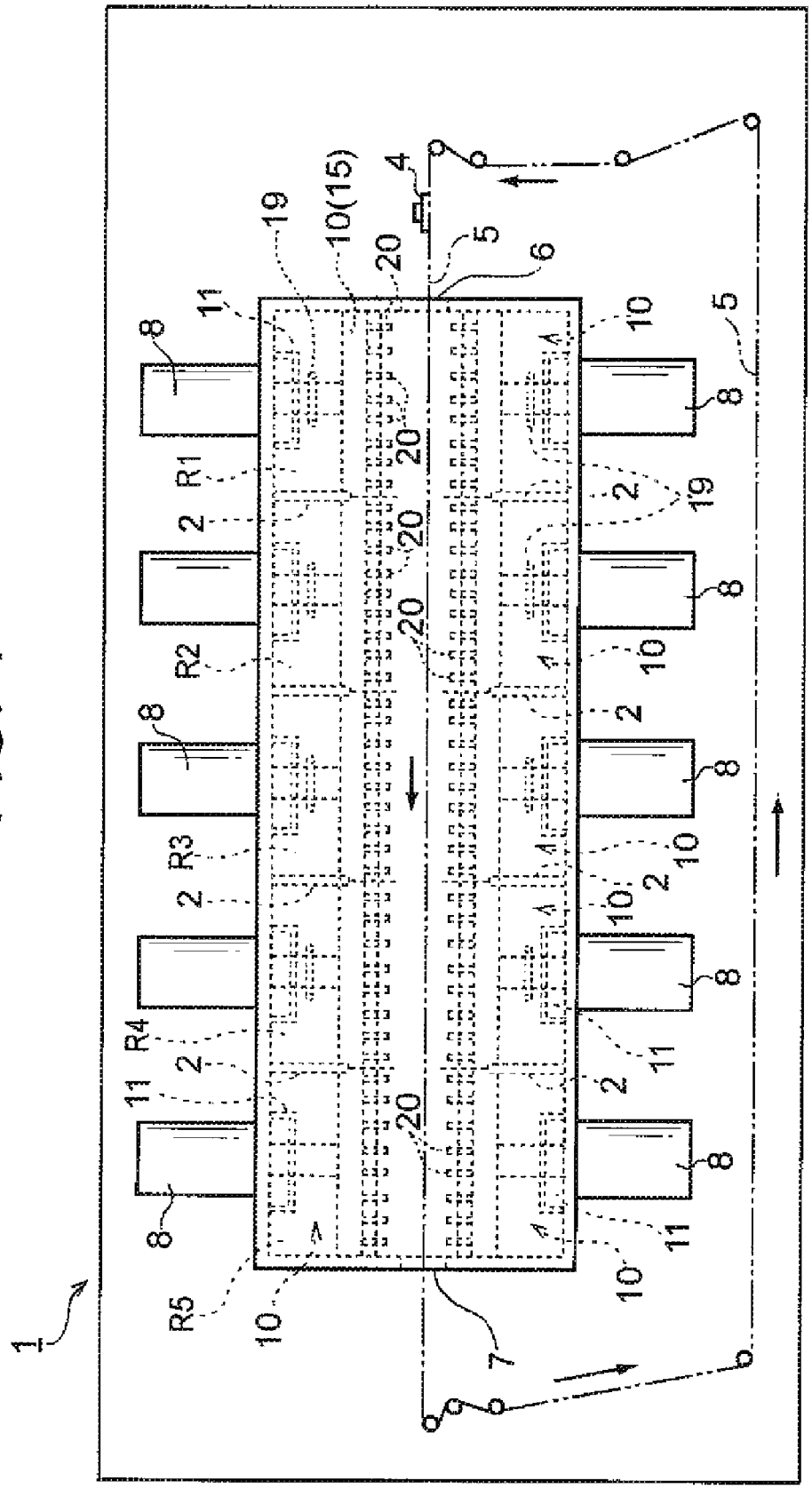
FIG. 1 is a diagram schematically illustrating a reflow furnace according to the first embodiment of the present invention.

As shown in FIG. 1, the reflow soldering device includes an elongated reflow furnace 1. This reflow furnace 1 is a nitrogen reflow furnace supplied with gaseous nitrogen as an inert atmosphere to prevent electronic components and solder from being oxidized and controlled to keep the nitrogen concentration in the in-furnace inert atmosphere in a constant range. However, the reflow furnace 1 may be an air reflow furnace supplied with air instead of gaseous nitrogen. The reflow furnace 1 includes first to fifth chambers R1 to R5 separated from each other by dividing the inner space of the furnace 1 by a plurality of partition walls 2 located at intervals in the transport direction indicated with an arrow in FIG. 1. The reflow furnace 1 is designed such that the first to fourth chambers R1 to R4 make a heating zone whereas the fifth chamber forms a cooling zone. The number of such chambers included in the reflow furnace 1 may be determined as required, and the fifth chamber R5 as the cooling zone may be omitted.

A printed circuit board 4 having electronic components put in position thereon via solder cream is transported by a conveyor 5 into the reflow furnace 1 through an inlet opening 6 of the furnace 1, then transported through the first to fifth chambers R1 to R5 sequentially, and then brought out of the reflow furnace 1 through an outlet opening 7 of the furnace 1. As will be described later in detail, heated atmosphere is blown to the printed circuit board 4 in the first to fourth chambers R1 to R4 to heat the circuit board 4, and unheated atmosphere is next blown to the circuit board 4 in the fifth chamber R5 to cool the circuit board 4. Temperature and velocity of the heated atmosphere blown onto the circuit board 4 can be set by a controller (not shown) as desired in the individual first to fourth chambers R1 to R4. Similarly, velocity of the cooling air blow blown to the circuit board 4 in the fifth chamber R5 can be set freely by the controller. The reflow furnace 1 shown here as the first embodiment is designed adequate for preheating the circuit board 4 in the first to third chambers R1 to R3, and next heating it in the fourth chamber R4 to melt the solder cream. Further, the reflow furnace 1 is designed adequate for cooling in the fifth chamber R5 the circuit board 4 having the electronic components joined thereto in the fourth chamber R4 to resolidify the solder once melted in the fourth chamber R4. Then, the furnace 1 brings the circuit board 4 out of the reflow furnace 1.

Each of the heating chambers R1 to R4 of the reflow furnace 1 has air circulating mechanisms 10 above and below the conveyor 5, respectively, which have an identical in configuration. One of them, which is located above the conveyor 5, is taken to explain the configuration below with reference to FIG. 2.

The air circulating mechanism 10 includes a blower 11 driven by a motor 8 provided outside the reflow furnace 1. The blower 11 has a suction opening 12 open downwardly and a blowout opening 13 open laterally. The blower 11 cooperates with an air guide unit 15 to circulate an atmosphere in each of the chambers R1 to R5.

Figure 2:
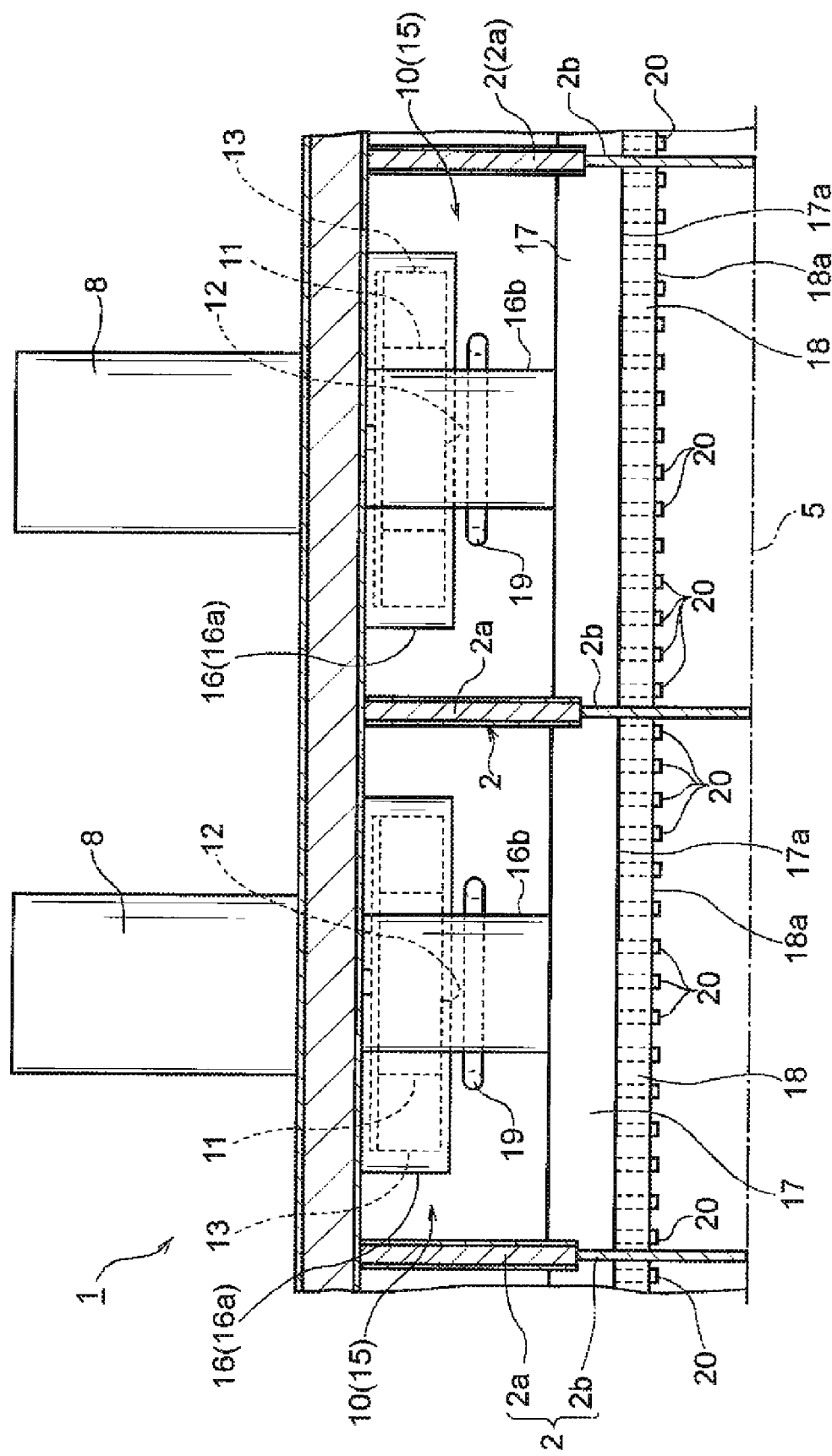
FIG. 2 is a cross-sectional view of the reflow furnace shown in FIG. 1, taken along the circuit board transport direction to explain the upper structure of each chamber of the reflow furnace.
Figure 3:
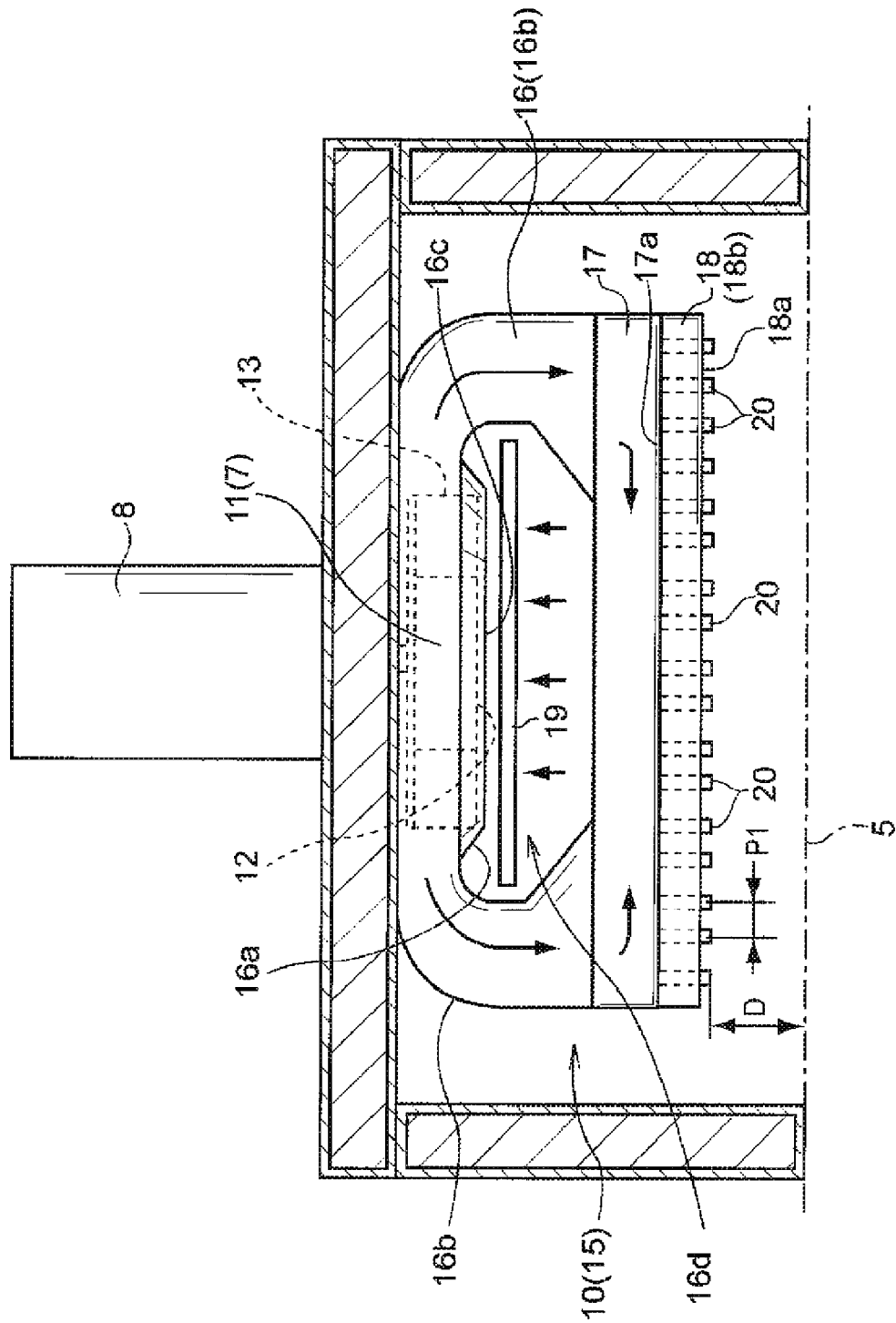
FIG. 3 is a cross-sectional view of the reflow furnace shown in FIG. 1, taken along the normal to the circuit board transport direction to explain the upper structure of each chamber of the reflow furnace.

As shown in FIGS. 2 and 3, the atmosphere guide unit 15 has a sectional structure including a first guide member 16, second guide member 17 and atmosphere recovery box 18. FIG. 2 is a cross-sectional view of the reflow furnace 1, taken along the transport direction of the conveyor 5, and FIG. 3 is a cross-sectional view of the reflow furnace 1, taken along a direction perpendicular to the transport direction of the conveyor 5.

As shown in FIG. 3 that is a cross-sectional view taken along a direction perpendicular to the transport direction, the first guide member 16 includes a blower housing 16a and atmosphere guide 16b. The blower 11 is provided in the blower housing 16a. The blower housing 16a has formed therein an inlet 16c open downward to face to the suction opening 12 of the blower 11. An atmosphere taken into the blower 11 through the inlet 16c and blown out horizontally from the blower 11 is guided to the second guide member 17 through an atmosphere guide 16b extending in a direction perpendicular to the transport direction of the circuit board and then bent downward.

The second guide member 17 is shaped like a rectangular closed box. It functions as a chamber to accept the atmosphere blown out from the blower 11. The second guide member 17 has a rectifying mechanism (not shown) disposed therein. The atmosphere recovery box 18A is positioned adjacent to the bottom of the second guide member 17.

The blower housing 16a and atmosphere guide 16b of the first guide member 16, in combination, define a space 16d in which a heater 19 is set (FIG. 3). The space 16d serves as a heating space. The atmosphere heated by the heater 19 in this space 16d is introduced into the blower 11 through the inlet 16c of the blower housing 16a. The air-heating space 16d is supplied with the atmosphere introduced into the atmosphere recovery box 18 through an opening defined by the pair of atmosphere guides 16b of the first guide member 16 and open in the transport direction of the circuit board and through a plurality of openings (not shown) formed in a lateral wall 18b (FIG. 3) of the atmosphere recovery box 18, which is oriented across the transport direction of the circuit board.

Figure 4:
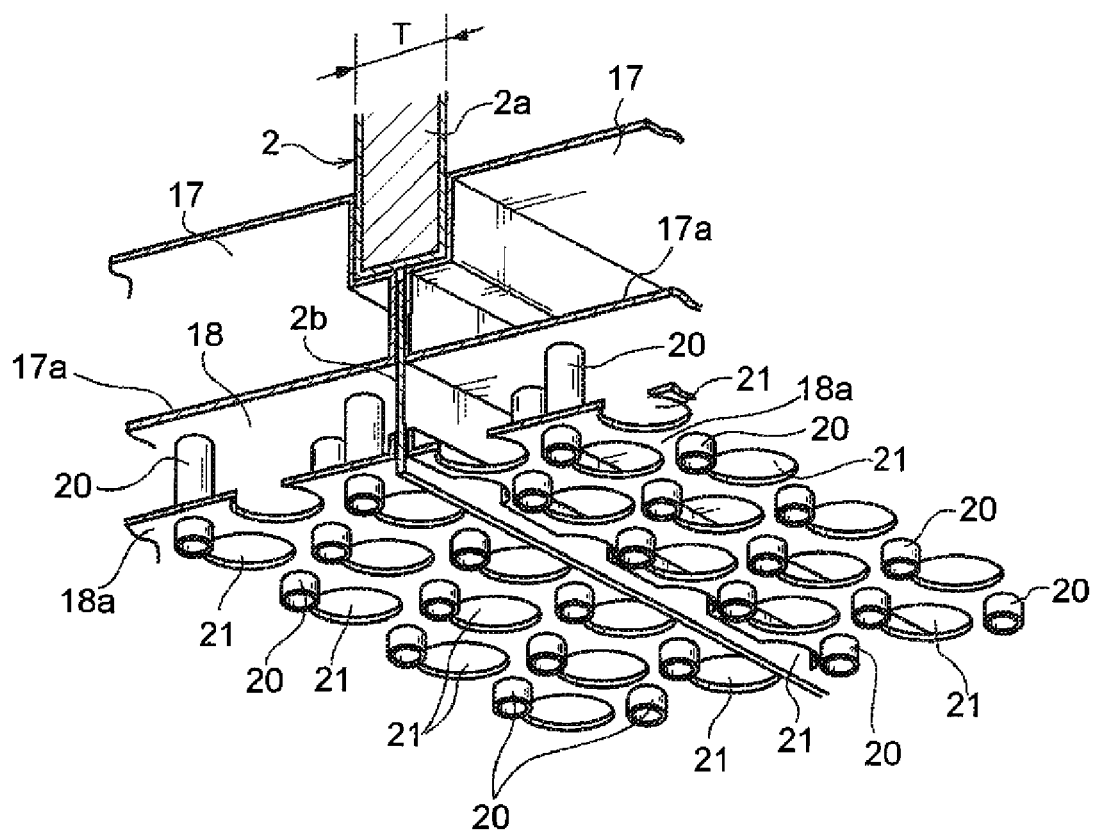
FIG. 4 is a diagram for explaining atmosphere blowout holes and recovery holes provided in an atmosphere circulating mechanism located in an upper position of the reflow furnace in FIG. 1.

The second guide member 17, which is a chamber providing the blow path, is bottomed by a horizontal plate 17a. The horizontal plate 17a has a number of holes formed equidistantly in a staggered pattern. In each of these holes, an atmosphere blowout pipe 20 is fixed to extend vertically downward (FIG. 4). The blowout pipes 20 penetrate the atmosphere recovery box 18 and project downward beyond it. In this first embodiment, all these blowout pipes 20 are identical in inner diameter and length. In other words, the distance D from the lower end of each blowout pipe 20 to the horizontally-extending support surface of the conveyor 5 (as shown in FIG. 5) is constant.

The pitch P1 between adjacent blowout pipes 20 is preferably less than 30 mm. It is 12 mm in this embodiment. Also, the inner diameter of each blowout pipe 20 should desirably be less than 3.5 mm. It is 2.6 mm in this embodiment. Also, the distance D from the lower end of the blowout pipes 20, that is, the atmosphere blowout opening, to the printed circuit board 4 is normally more than 20 mm. It is 22 mm in this embodiment.

The atmosphere recovery box 18 is bottomed by a second horizontal plate 18a having round holes 21 at an equidistant position from adjacent blowout pipes 20. More specifically, in the second plate 18a, each of the circular holes 21 is formed in the middle position between adjacent blowout pipes 20 in a longitudinal row of the blowout pipes 20 aligned along the transport direction of the conveyor 5 and in a lateral row of the blowout pipes 20 aligned in a direction across the transport direction. The atmosphere in each of the chambers R1 to R5 is introduced into the atmosphere recovery box 18 through the holes 21, which are round, for example.

Heretofore explained is the atmosphere circulating mechanism 10 provided above the conveyor 5. The atmosphere circulating mechanism 10 provided below the conveyor 5 need not have the same configuration as the atmosphere circulating mechanism 10 above the conveyor 5 because the lower surface of the conveyor 5 is not the support surface for the printed circuit board 4. The atmosphere circulating mechanism 10 in the fifth chamber (cooling zone) 5R preferably has the same configuration as the above-mentioned one 10 except that it has no heater 19.

The partition walls 2 between the adjacent chambers R1 and R2, R2 and R3, R3 and R4 and R4 and R5, respectively, extend toward the conveyor 5 from above and below. FIGS. 2 and 4 show the partition walls 2 provided above the conveyor 5. The partition wall 2 provided above the conveyor 5 includes a heat-insulating wall portion 2a and a metal-plate wall portion 2b. The heat-insulating wall portion 2a, which is the proximal end portion of the partition wall 2 adjacent to the upper portion of the reflow furnace 1, is made of a heat-insulating material having a thickness T (FIG. 4). The lower portion of the partition wall 2 is the metal-plate wall portion 2b extending from the heat-insulating wall portion 2a toward the conveyor 5. The metal-plate wall portion 2b is 0.8 mm thick. The metal-plate wall portion 2b extends downward through the second guide member 17, starting at the middle of the height of the latter, and then through the atmosphere recovery box 18. Therefore, the distance between the adjacent blowout pipes 20 across the partition wall 2 can be designed equal to that between the adjacent blowout pipes 20 inside each of the chambers R1 to R5. It should be noted that a portion, adjacent to the conveyor 5, of each of the partition walls 2 provided under the conveyor 5 may be formed from a single metal-plate wall portion 2b as in each of the above-mentioned partition walls 2 provided above the conveyor 5 or may be formed from only the heat-insulating wall 2a as in the convention reflow furnaces.

The printed circuit board 4, having electronic components thereon and put on the conveyor 5, is brought into the reflow furnace 1 from the inlet opening 6, then along a horizontal conveyance line inside the reflow furnace 1, and out of the latter from the outlet opening 7 (as in FIG. 1). During this conveyance, the circuit board 4 goes through the first to fifth chambers R1 to R5. In the first to fourth chambers R1 to R4 as the heating zone, a heated atmosphere controlled to a predetermined temperature by the heater 19 is blown from the blower 11 through the first guide member 16 to the second guide member 17 in which it will be distributed to the blowout pipes 20. Then, the hot atmosphere is blown out vertically downward through the blowout pipes 20 (as in FIG. 3). The circuit board 4 on the conveyor 5 is heated by the hot atmosphere applied from just above, the electronic components are thus soldered to the circuit board 4 in the fourth chamber R4, cooling air or unheated air is applied to the circuit board 4 in the fifth chamber R5 to cool the circuit board 4, and then the circuit board 4 is brought out of the reflow furnace 1 through the outlet opening 7.

The atmosphere in each of the chambers R1 to R4 is introduced into the atmosphere recovery box 18 through the atmosphere recovery holes 21 (as in FIG. 4). The atmosphere sucked into the atmosphere recovery box 18 goes out from a horizontal opening (not shown), and enters the atmosphere-heating space 16d through an aperture defined by the pair of atmosphere guides 16b of the aforementioned first guide member 16 and open toward the direction of transporting the circuit board (as shown in FIG. 3). The atmosphere is heated by the heater 19 in the atmosphere-heating space 16d is introduced into the blower 11 through the suction opening 12. Then, the heated atmosphere is distributed by the blower 11 to the blowout pipes 20 through the first and second guide members 16 and 17, and blown out of the blowout pipes 20 onto the printed circuit board 4 transported by the conveyor 5 to heat the circuit board 4 having the electronic components thereon (as in FIG. 5A). The temperature of the hot atmosphere blown out of the blowout pipes 20 onto the circuit board 4 is controlled by the aforementioned controller. Also, the velocity of the hot atmosphere blown out from the blowout pipes 20 can be adjusted by controlling the speed of the blower 11. For example, the atmosphere velocity is set in three steps (high, middle, low) any of which is freely selectable by the user. The velocity of the vertical atmosphere blown out from the blowout pipes 20 onto a printed circuit board 4a is settable to 6.5 m/sec, for example.

As a typical example of the reflow soldering, the printed circuit board 4 having the electronic components thereon is preheated in the first to third chambers R1 to R3, and then heated in the fourth chamber R4 to melt the solder cream. Thereafter, the circuit board 4 is moved into the fifth chamber R5, namely, into the cooling zone, in which cooling air or unheated air is applied to the circuit board 4 to cool the soldered portions. Here, the soldering is over.

Figure 5A:
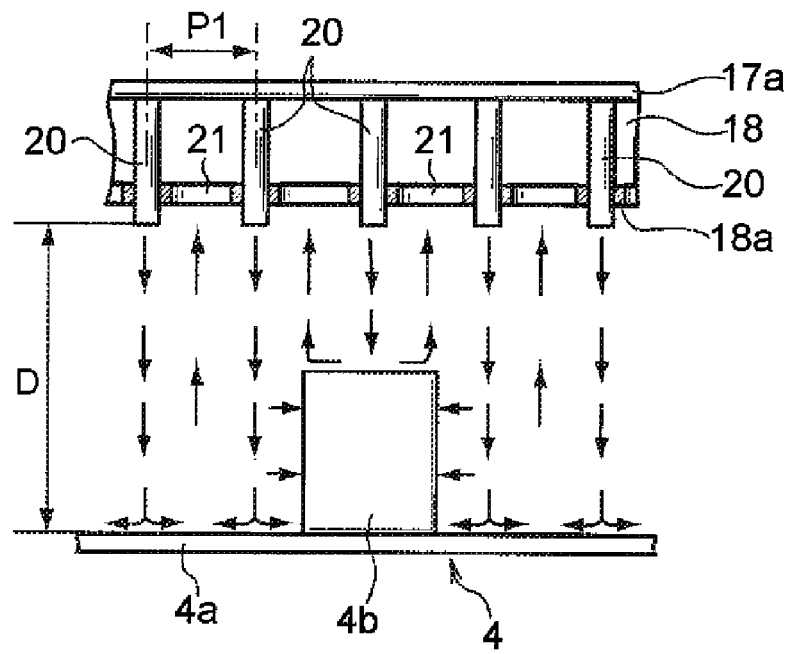
FIG. 5 is a diagram for explaining operations and effects of the first embodiment through explanation of a horizontal blow of atmosphere applied to electronic components on a printed circuit board, in which FIG. 5A explains the horizontal blow applied in the central region of each chamber and FIG. 5B explains the horizontal blow near the partition walls.
Figure 5B:
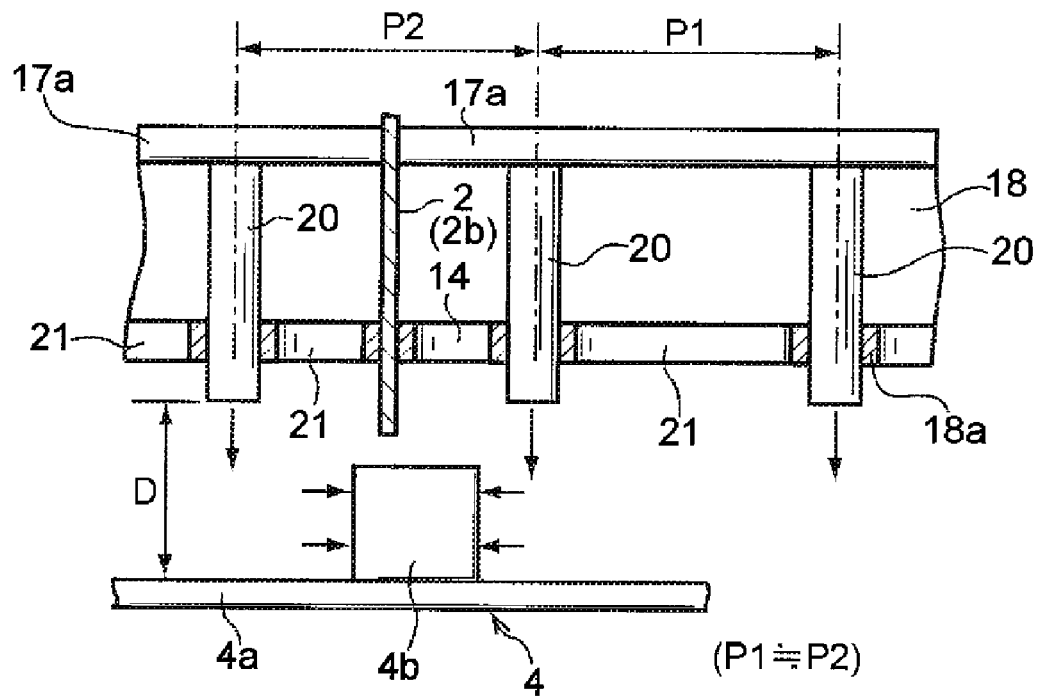

Inside the reflow furnace 1, the printed circuit board 4 having the electronic components thereon is transported by the conveyor 5, it is exposed to hot air blown vertically downward from the blowout pipes 20. After being applied to the circuit board 4a and electronic components 4b put in position on the solder cream on the circuit board 4a, the hot air becomes a horizontal blow which will be applied to the lateral side of the electronic components 4b, as shown in FIG. 5A. The velocity of the horizontal blow applied to the lateral side of the electronic components 4b is not uniform in the transport direction of the conveyor 5. However, since the horizontal blow resulted from the hot air blown out from one blowout pipe 20 and that resulted from the hot air blown out from the other blowout pipe 20 will interfere with each other inside each of the chambers R1 to R5, the influence of the horizontal blow on the displacement of the electronic components 4b can substantially be neglected.

In addition, the portion, near the conveyor 5, of the partition wall 2 is the thinner metal-plate wall portion 2b (as in FIG. 4). So, the pitch P2 between the blowout pipes 20 across the metal-plate wall portion 2b (as in FIG. 5B) can be set substantially same as the pitch P1 (12 mm) between the adjacent blowout pipes 20 in each of the chambers R1 to R5. Therefore, the condition inside the chambers R1 to R5 can be made substantially same as that near the partition walls 2, and the printed circuit board 4 can pass by the partition walls 2 under reduced variation of the horizontal blow (air-velocity difference). In the experiments made by the Inventors of the present invention, the air-velocity difference between at the partition walls could be limited to about 0.5 m/sec. As a result, when the circuit board 4a having the electronic components 4b moves past the partition walls 2, the horizontal blow impinging the lateral side of the electronic components 4b on the circuit board 4a (see FIG. 5B) is reduced in velocity difference, and the electronic components 4b are protected from undesirable movement from proper positions on the circuit board 4a.

The above is also true when the printed circuit board 4a having the electronic components 4b thereon moves from the fourth chamber R4, namely, the heating zone, into the fifth chamber R5, namely, the cooling zone. Thus, the electronic components 4b can be prevented from undesirable displacement on the circuit board 4a.

Figure 6:
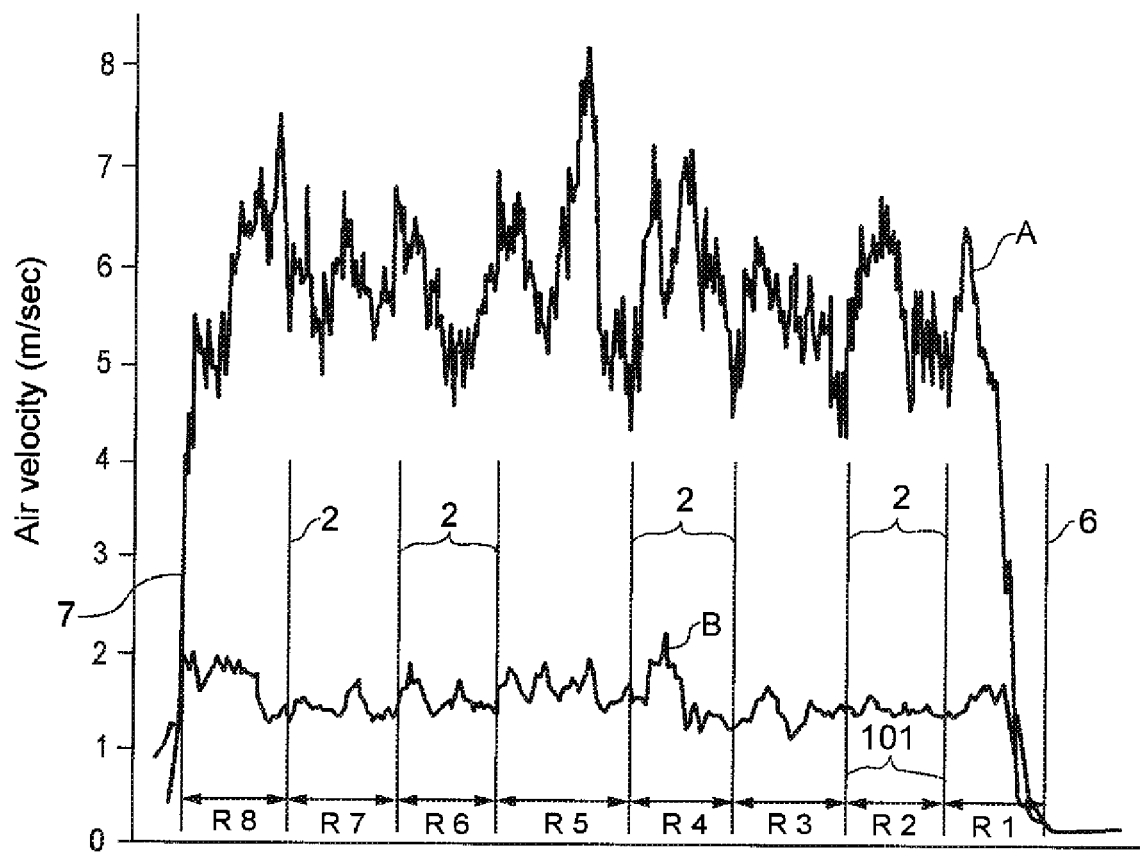
FIG. 6 shows curves resulted from plotting of measured vertical and horizontal atmosphere blows in the first embodiment, in which "A" indicates the curve of the vertical blow and "B" indicates that of the horizontal blow.

FIG. 6 graphically depicts atmosphere blown vertically (vertical blow) and atmosphere blown horizontally (horizontal blow), measured along an conveyance line from an inlet opening to outlet opening of a reflow furnace 1 including eight chambers instead of the aforementioned five chambers R1 to R5. The eight chambers have the substantially same configuration as the five chambers R1 to R5. In FIG. 6, "A" indicates the vertical blow and "B" indicates the horizontal blow. The results of experiments revealed that with the local variation in velocity of the horizontal blow B being less than 1.5 m/sec, the electronic components could be prevented from being displaced. The results of measurement of the local variation in velocity of the horizontal blow B (as in FIG. 6) also revealed that the variation in velocity of the horizontal blow was successfully limited to less than 2 m/sec and the local variation in velocity of the horizontal blow near the partition walls 2 could be minimized. Therefore, in case the vertical blow velocity is set to over 3 m/sec, especially, to over 6 m/sec, this reflow furnace is effect in preventing the electronic components from being displaced under the influence of the horizontal blow.

That is, the aforementioned first embodiment has proposed to make the pitch P2 between the adjacent blowout pipes 20 across each partition wall 2 substantially same as the pitch P1 between the blowout pipes 20 in each of the chambers R1 to R5 by decreasing the thickness of the lower portion of the partition walls 2. Thereby, a region having a predetermined length in the direction of transporting the printed circuit board and including regions before and after the partition wall 2 can provide environments for the vertical and horizontal blows, substantially same as the region whose length in the direction of transporting the circuit board is equal to the predetermined length and included inside each of the chambers R1 to R5. Thus, the electronic components 4b can be prevented from being displaced under the influence of the horizontal blows while passing by the partition walls 2.

In the foregoing, there has been described the suppression of the variation of the horizontal blow when the printed circuit board 4 is passing by the partition walls 2 defining the chambers R1 to R5 inside the reflow furnace 1. To prevent the electronic components 4b from being displaced by the horizontal blow applied thereto when entering the first chamber R1 through the inlet opening 6 of the reflow furnace 1, the techniques adopted in the second and subsequent techniques explained later may preferably be used to attenuate the vertical blow impinging vertically onto the printed circuit board 4 near the inlet opening 6, which is also true for the vertical blow applied to the circuit board 4 near the outlet opening 7 of the reflow furnace 1. Namely, it is also desirable to decrease the force of the blow applied vertically to the circuit board 4 near the outlet opening 7. Especially in the case of a reflow furnace including no cooling chamber, such reduction of the force of the vertical blow applied to the circuit board 4a near the outlet opening 7 permits to effectively prevent the electronic components 4b from being displaced under the influence of the vertical airflow.

Figure 7:
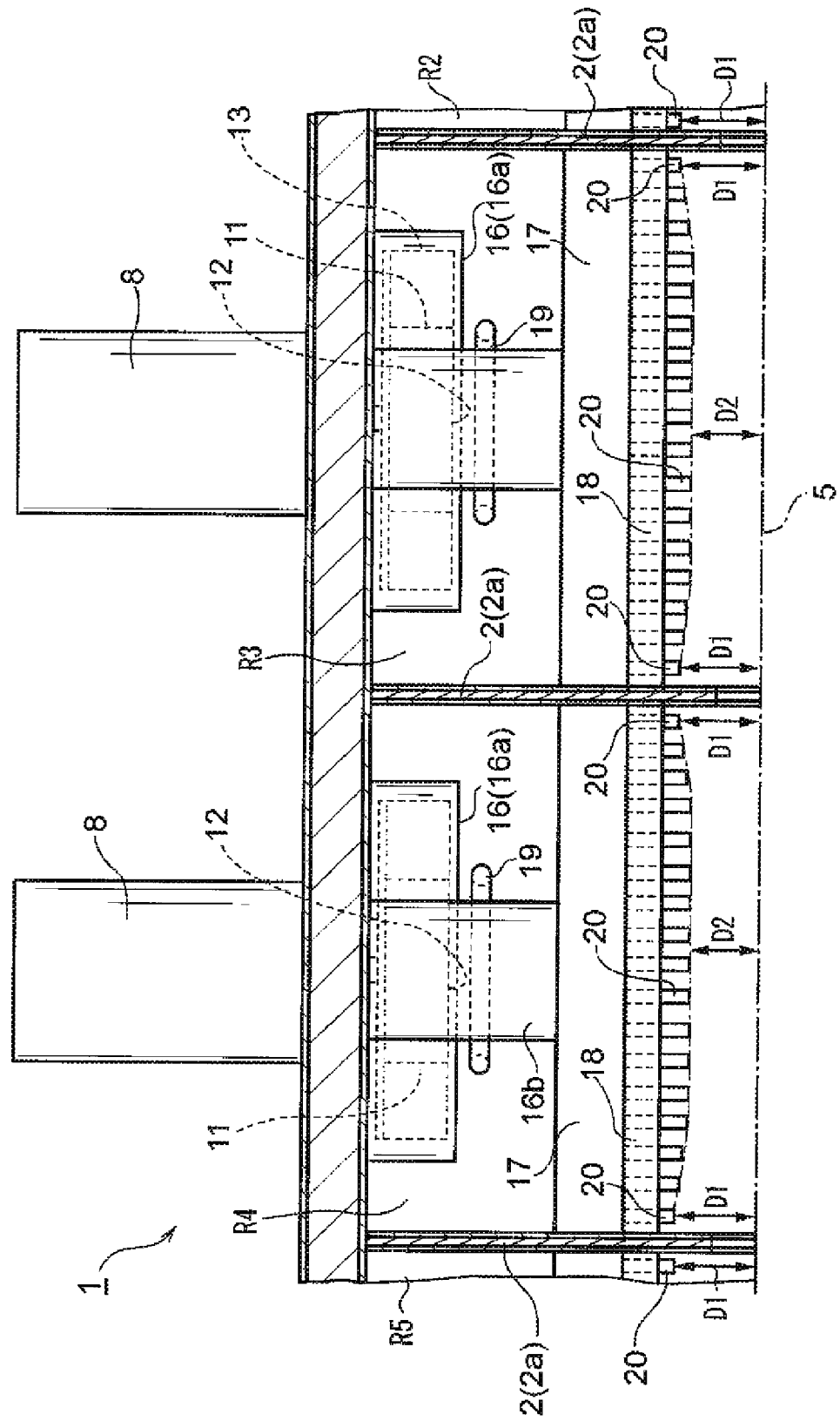
FIG. 7 is a cross-sectional view of a reflow furnace according to the second embodiment of the present invention, taken along the transport direction of the circuit board.
Figure 8:
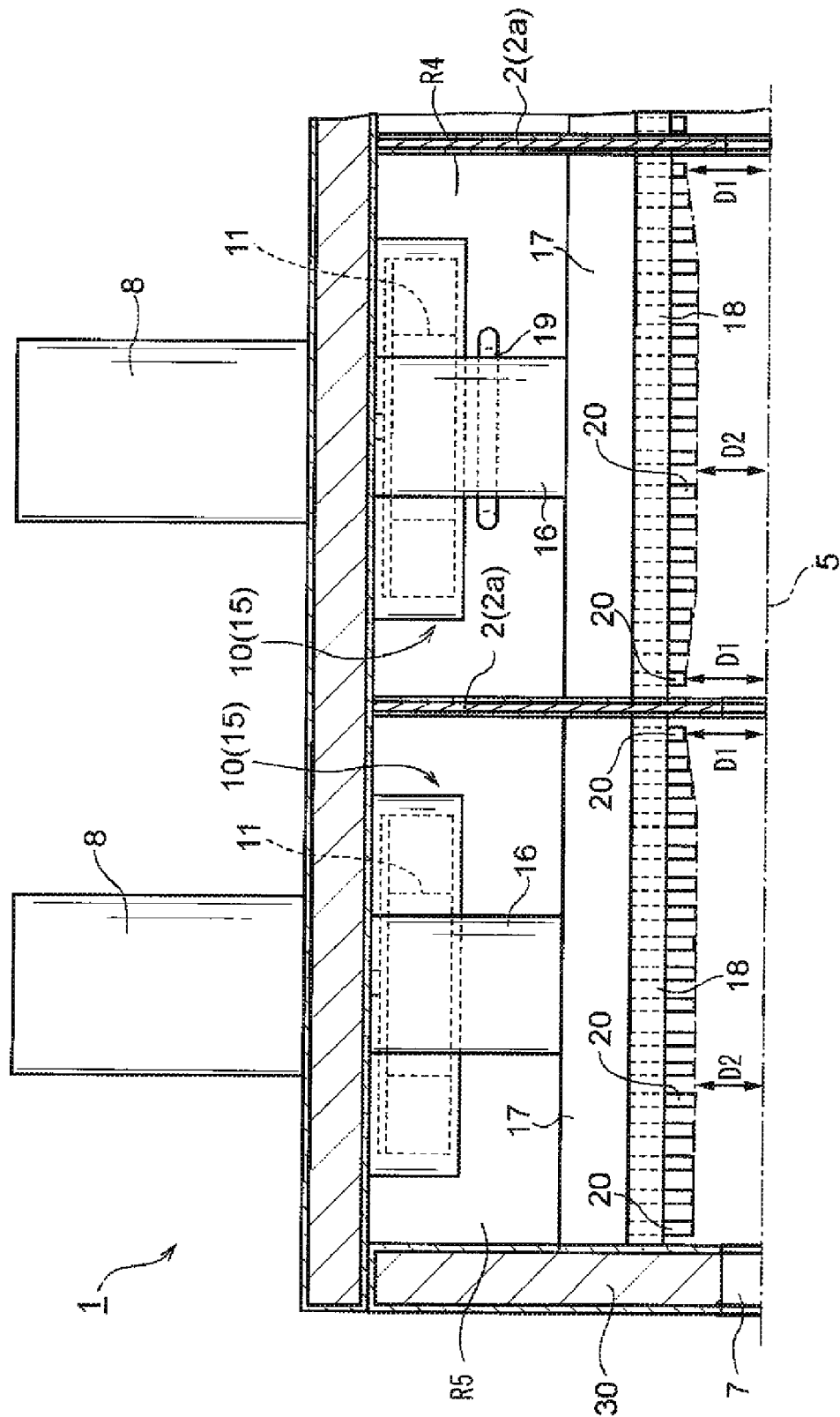
FIG. 8 is a cross-sectional view of the reflow furnace in FIG. 7, taken along the transport direction of circuit board to explain the upper portion of a fifth chamber as a cooling zone and a fourth chamber that is a heating zone located upstream of the fifth chamber.

Second Embodiment (Also See FIGS. 7 and 8)

The second embodiment proposes to vary the distance D between the lower end, namely, blowout end, of the blowout pipe 20, and the printed circuit board 4 inside each of the chambers R1 to R5 so that the distance D between the lower end of the blowout pipe 20 and the circuit board 4 is longer near the partition wall 2 while the distance D between the lower end of the blowout pipe 20 and the circuit board 4 is shorter in the middle of each of the chambers R1 to R5. Namely, the distance D is set such that the atmosphere will be blown onto the circuit board 4 from far in the region near the partition wall 2 of each of the chambers R1 to R5 while it will be blown onto the circuit board 4 from near in the middle of each of the chambers R1 to R5.

FIG. 7 shows an example in which the blowout pipes 20 across the partition wall 2 between the chambers adjacent to each other in the heating zone including the first to fourth chambers R1 to R4 are set relatively short in length. As will be seen from FIG. 7, concerning the third chamber R3, for example, the blowout pipe 20 nearest to the partition wall 2 is shortest and the distance D1 between that blowout pipe 20 and the printed circuit board 4 is longest. The blowout pipe 20 positioned in the middle of the third chamber R3, located along the transport direction of the circuit board 4, is set long, and the distance D2 between this blowout pipe 20 and the circuit board 4 is short (D2<D1). The distance D2 between the blowout pipe 20 in the middle of the third chamber R3 and the circuit board 4 may be set the same as that (22 mm) in the first embodiment or longer (30 mm).

Preferably, the blowout pipes 20 provided between the blowout pipe 20 nearest to the partition wall 2 and the blowout pipe 20 present in the middle of each chamber are gradually longer in a direction from the middle of the chamber toward the partition wall 2. Therefore, in each of the chambers R1 to R4 forming the heating zone, the distance D2 between the lower end of the blowout pipes 20 and the printed circuit board 4 is relatively short in the middle of the chamber, located along the transport direction of the circuit board. In a direction from the middle of each chamber toward the partition wall 2, the distance between the lower end of the blowout pipes 20 and circuit board 4 is gradually longer, and the distance D1 between the lower end of the blowout pipe 20 adjacent to the partition wall 2 and the circuit board 4 is set longest. Of course, in a direction from the middle of each of the chambers R1 to R4 toward the partition wall 2, the distance between the lower end of the blowout pipes 20 and circuit board 4 may be stepwise longer.

FIG. 8 shows an example in which the blowout pipes 20 across the partition wall 2 between the fifth chamber R5 as the cooling zone and the fourth chamber R4 provided upstream of the fifth chamber R5 is set relatively small in length. In FIG. 8, the reference numeral 7 indicates an outlet opening of the reflow furnace 1. The blowout pipe 20 nearest to the partition wall 2 between the fifth chamber R5 as the cooling zone and the fourth chamber R4 as the heating zone is shortest, and thus the distance D1 between this blowout pipe 20 and printed circuit board 4 is longest. The blowout pipes 20 including from one located in the middle of the cooling chamber R5, located along the transport direction of the circuit board, to one adjacent to the outlet wall 30 of the reflow furnace 1, are set long, and thus the distance D2 between these blowout pipes 20 and the circuit board 4 is short (D2<D1). It should be noted that the distance D2 between these blowout pipes 20, including one in the middle of the cooling zone R5 to one adjacent to the outlet wall 30, and the circuit board 4 may be the same as that (22 mm) in the first embodiment but may be set longer (30 mm).

In a direction from the middle of the cooling zone R5 toward the partition wall 2 between the cooling zone R5 and fourth chamber R4, the blowout pipes 20 are gradually longer. Therefore, in the fifth chamber R5 as the cooling zone, the distance between the lower end of the blowout pipes 20 and the printed circuit board 4 is set relatively short (D2) in the middle of the chamber, located along the transport direction of the circuit board, and in a region located downstream of the chamber center. Thus, in a direction from that middle of the chamber R5 toward the partition wall 2, the distance between the lower end of the blowout pipes 20 and circuit board 4 is gradually longer. The distance between the lower end of the blowout pipe 20 adjacent to the partition wall 2 and the circuit board 4 is set longest (D1).

By setting the distance between the lower end, namely, blowout end, of the blowout pipe 20 and the printed circuit board 4 having the electronic components thereon to be gradually longer in a direction toward the partition wall 2 in a region near the latter as mentioned above, it is possible to decrease the force of the vertical blow applied to the circuit board 4 and thus reduce the velocity of the horizontal blow in the region near the partition wall 2. Thus, the horizontal blow applied to the electronic components 4b when the circuit board 4a passes by the partition wall 2 can be attenuated, whereby the electronic components 4b can be prevented from moving off their proper positions on the circuit board 4a. Also, since the electronic components 4b can thus be prevented from being displaced when the circuit board 4a passes by the partition wall 2, the partition wall 2 may have a heat-insulative material provided therein to extend from the base to lower end thereof. That is, it is possible independently of the thickness of the partition wall 20 to prevent the electronic components 4b from being displaced when the circuit board 4a passes by the partition wall 2.

Of course, the distance between the lower end of the blowout pipes 20 and the printed circuit board 4 may be so set as to gradually or stepwise be longer in directions toward the inlet and outlet openings 6 and 7, respectively, in a region adjacent to at least the inlet opening 6 of the reflow furnace 1, preferably in both regions adjacent to the inlet and outlet openings 6 and 7.

For example, in case the distance between the lower end of the blowout pipes 20 near the outlet wall 30 and inlet wall (not shown), respectively, and the printed circuit board 4 is set long, the arrangement for reduction of the horizontal blow in this region permits to decrease the flow rate of the atmosphere, namely, inert gas, flowing out of the reflow surface 1 through the inlet and outlet openings 6 and 7, so that the running costs of the reflow furnace 1 can be reduced.

As a variant of the second embodiment, two types of blowout pipes 20, short and long, may be used in each of the chambers R1 to R5 of the reflow furnace 1. In this case, the relatively short blowout pipes 20 are positioned in regions adjacent to the partition walls 2, inlet and outlet openings 6 and 7, respectively, and the relatively long blowout pipes 20 are positioned in the central region of each of the chambers R1 to R5, located in the transport direction of the circuit board.

In the aforementioned second embodiment, the blowout pipes 20 across the partition wall 2 are decreased in length to reduce the velocity of the vertical blow of atmosphere applied to the printed circuit board 4 adjacent to the partition wall 2, whereby the influence of the horizontal blow near the partition wall 2 can be limited to prevent the electronic components from being displaced under the influence of the horizontal blow when the circuit board passes by the partition wall 2.

Figure 9:
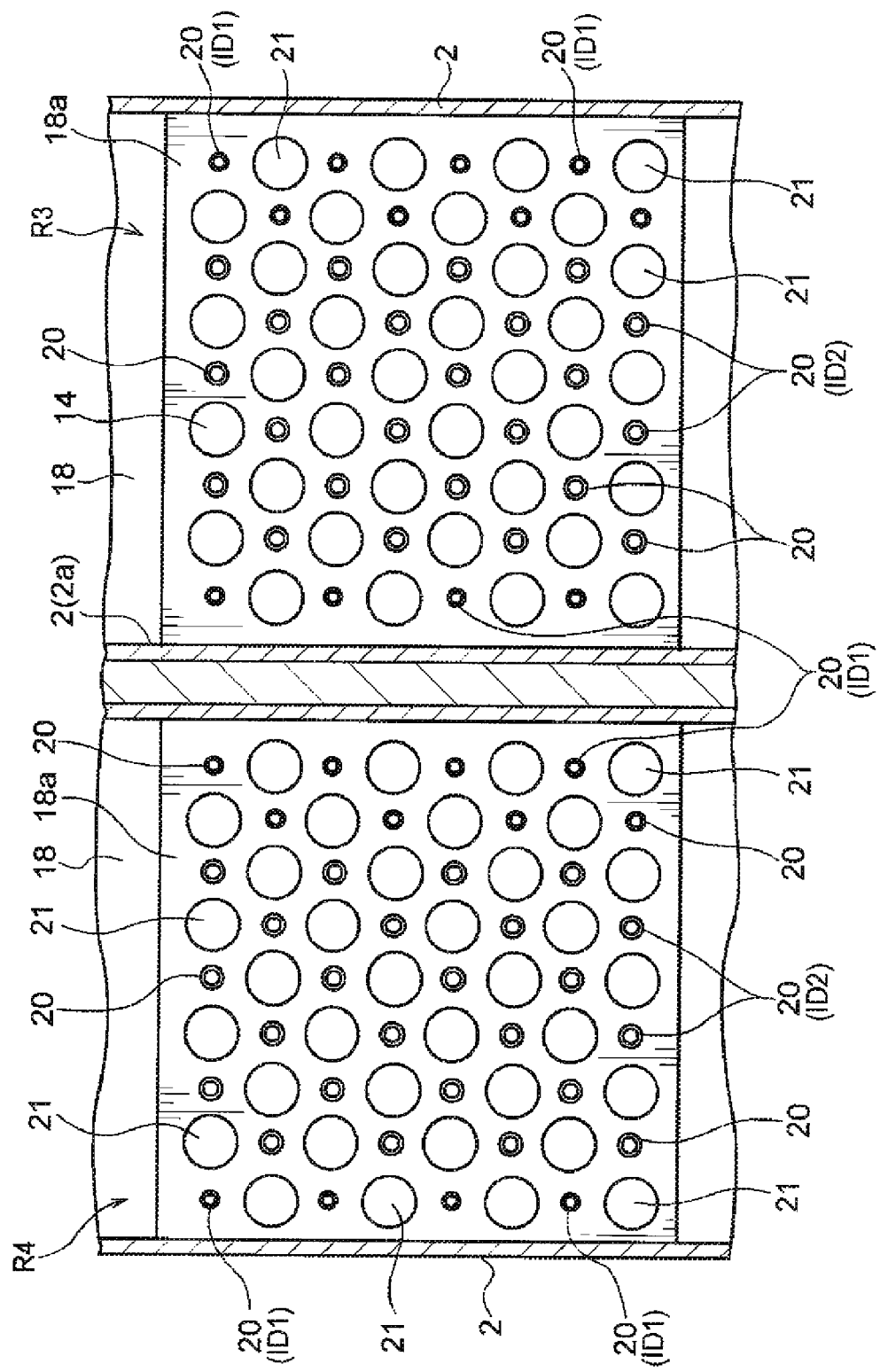
FIG. 9 is a diagram for explaining the upper portion of a reflow furnace according to the third embodiment of the present invention, especially its atmosphere blowout holes and recovery holes.
Figure 10:
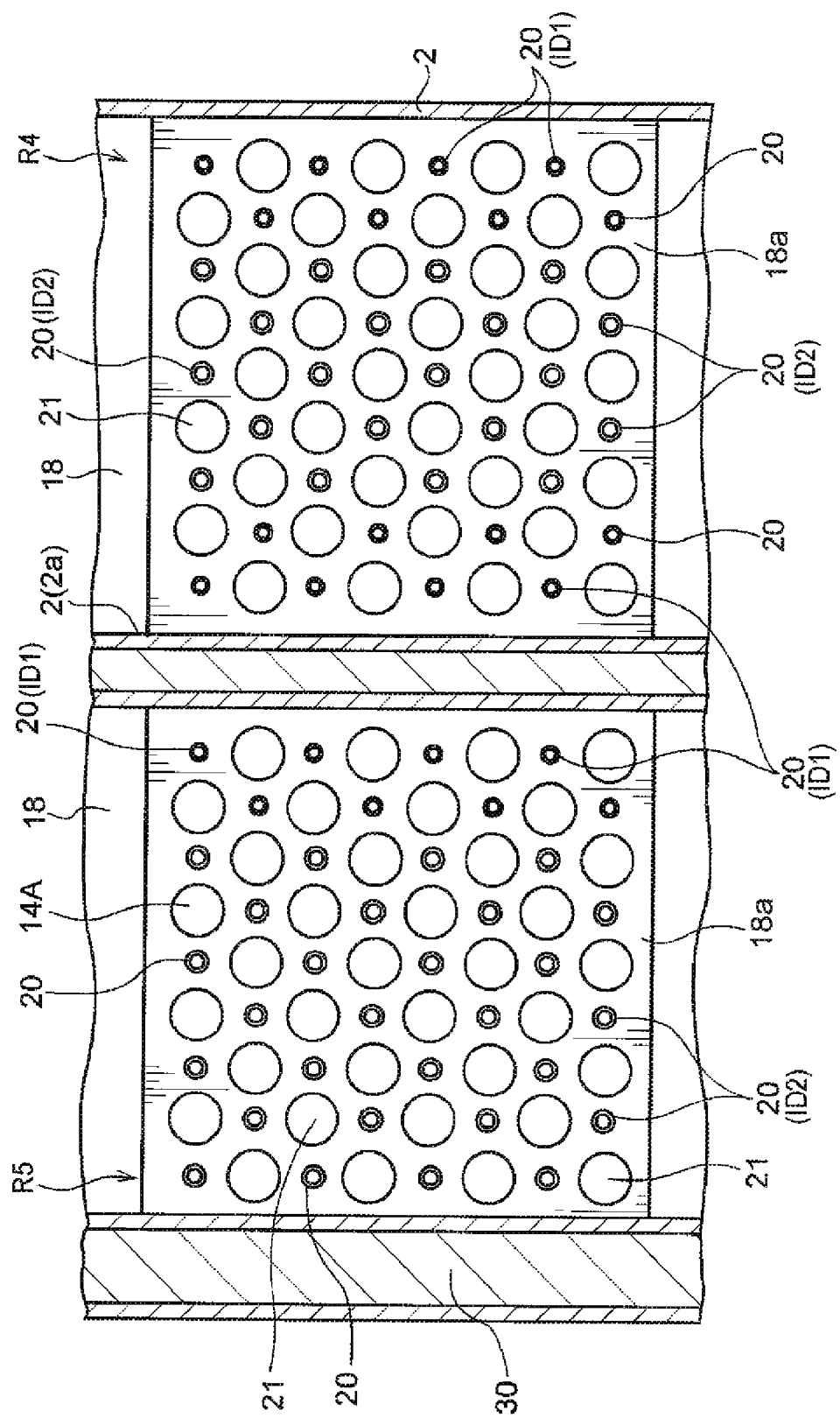
FIG. 10 is a cross-sectional view of the reflow furnace shown in FIG. 9, taken along the transport direction of the circuit board to explain the upper portion of a fifth chamber as a cooling zone and a fourth chamber that is a heating zone located upstream of the fifth chamber, together with atmosphere blowout holes and recovery holes.

Third Embodiment (FIGS. 9 and 10)

The second embodiment has been explained as varying the distance D between the lower end, namely, blowout end, of the blowout pipes 20 and the printed circuit board 4 in each of the chambers R1 to R5 so as to be long (D1) in the region close to the partition wall 2 while being short (D2) in the middle of each of the chambers R1 to R5. However, the third embodiment shown in FIGS. 9 and 10 proposes to vary the inner diameter, that is, effective cross-sectional area of the inner channel, of the blowout pipes 20 so that the inner diameter of the blowout pipe 20 close to the partition wall 2 will be small while that of the blowout pipe 20 in the middle of each of the chambers R1 to R5 will be large. It should be noted that the blowout pipes 20 shown in FIGS. 9 and 10 are equal in length to each other and thus the distances between the lower end of the blowout pipes 20 and circuit board 4 are all the same.

FIG. 9 is a view, from below, of the atmosphere recovery box 18 provided in the upper portion of each of the third and fourth chambers R3 and R4. As shown in FIG. 9, the blowout pipes 20 across each of the partition walls 2 included in the chambers R2 to R4 as the heating zone is set relatively small in inner diameter, while the inner diameter of the blowout pipe 20 in the middle in the transport direction in each chamber is set relatively large. That is, in the third chamber R3, for example, the inner diameter of the blowout pipe 20 nearest to the partition wall 2 is set smallest (ID1), while that of the blowout pipe 20 in the middle along the transport direction of the circuit board is set largest (ID2) (ID1<ID2). Further, the blowout pipes 20 including those between one nearest to the partition wall 2 and another in the middle of the chamber R3 are set gradually smaller in inner diameter in a direction from the middle of the chamber toward the partition wall 2.

FIG. 10 shows an example in which the inner diameter of the blowout pipes 20 across the partition wall 2 between the fifth chamber R5 as the cooling zone and the fourth chamber R4 is set relatively small. As shown in FIG. 10, the inner diameter of the blowout pipes 20 nearest to the partition wall 2 between the fifth chamber R5 as the cooling zone and the fourth chamber R4 as the heating zone and nearest to the outlet wall 30, respectively, is set smallest, that of the blowout pipes 20 located apart from the partition wall 2 and outlet wall 30 is set gradually larger, and that of the blowout pipe 20 in the middle of the cooling chamber R5, located in the transport direction of the circuit board is set largest.

By reducing the inner diameter of the blowout pipes 20 near the partition wall 2 to limit the flow rate of the atmosphere blown out from each blowout pipe 20, it is possible to decrease the force of the vertical blow applied to the printed circuit board 4. Consequently, it is possible to reduce the velocity of the horizontal blow of atmosphere applied to the electronic components 4b when the circuit board 4a having the electronic components 4b thereon passes by the partition wall 2 and to prevent undesirable displacement of the electronic components 4b from their proper positions on the circuit board 4. Also, since the electronic components 4b are prevented from undesirable changes in position when the circuit board 4a passes by the partition wall 2, the partition wall 2 used here may have be the heat-insulating material throughout its entire length from the proximal end to the distal end thereof. That is, positional displacement of the electronic components 4b while passing by the partition wall 2 can be prevented regardless of the thickness of the partition walls 2.

Note that by reducing the inner diameter of the blowout pipes 20 near the outlet wall 30 and inlet wall (not shown) to limit the flow rate of the atmosphere blown out from the blowout pipes 20, it is possible to reduce the amount of the atmosphere, namely, inert gas, flowing out of the reflow furnace 1 through the inlet and outlet openings 6 and 7, whereby the reflow furnace 1 can be operated with reduced costs.

Figure 11:
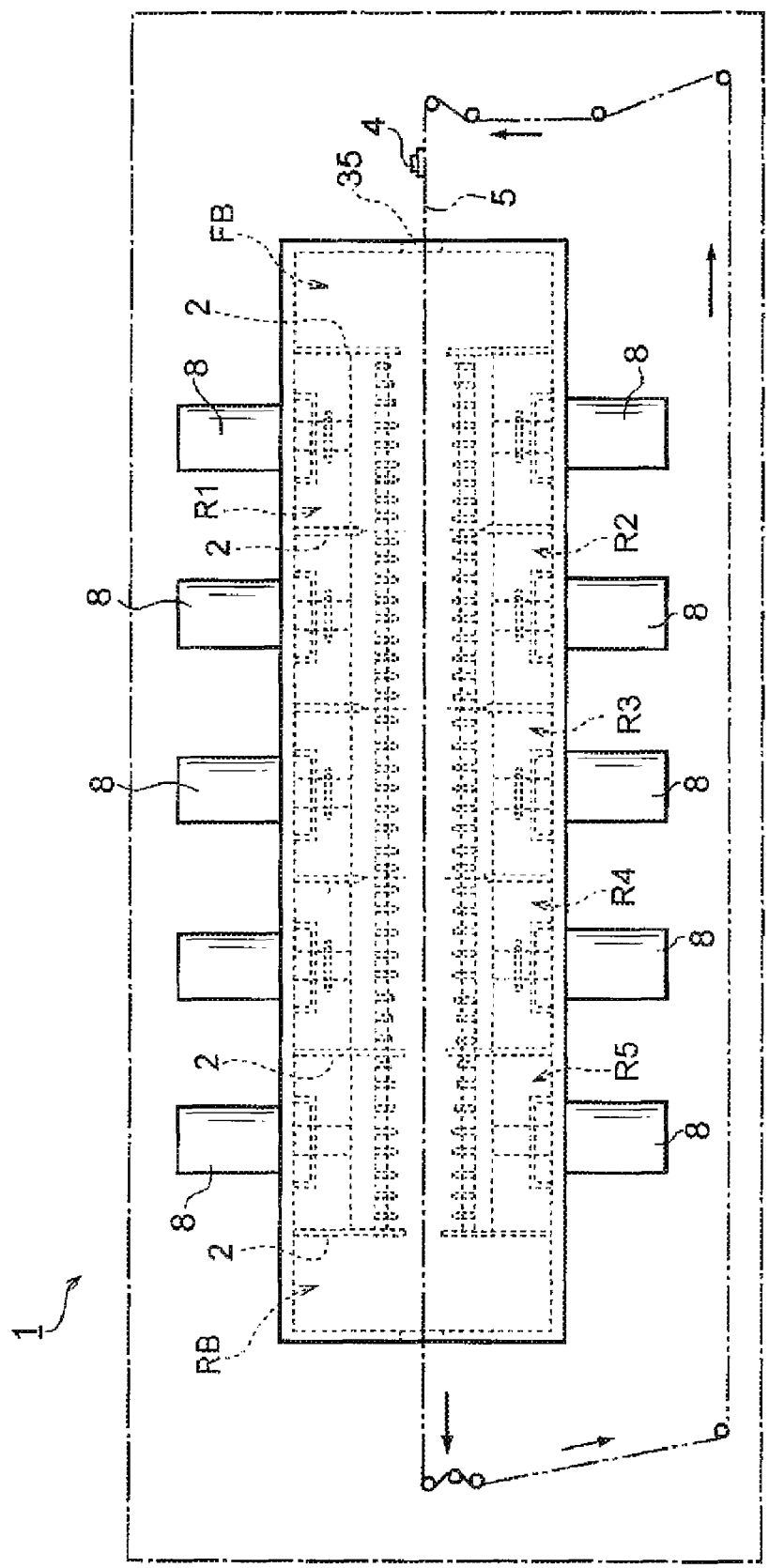
FIG. 11 is a diagram schematically illustrating a reflow furnace according to the fourth embodiment of the present invention.
Figure 12:
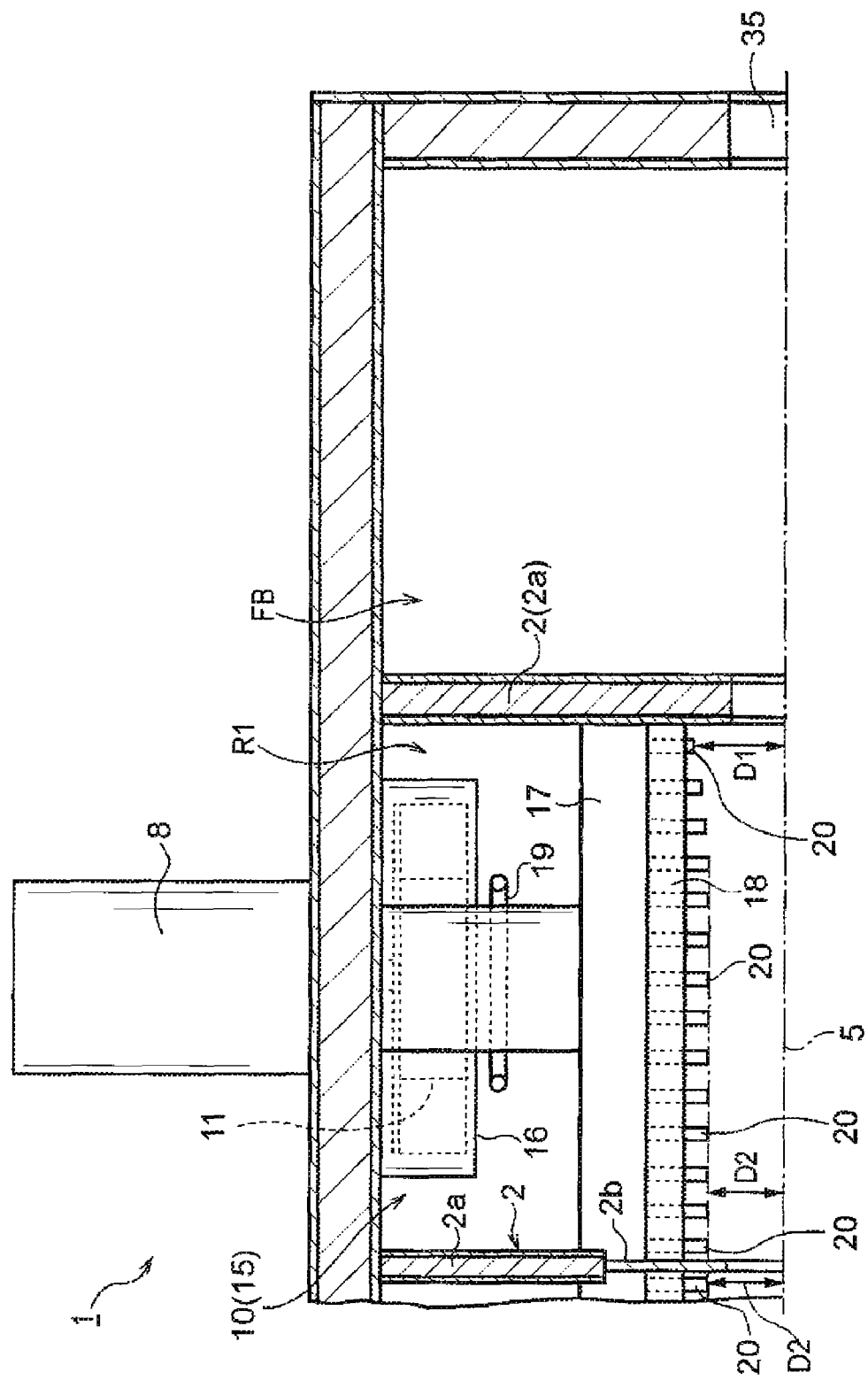
FIG. 12 is a diagram for explaining an inlet-side buffer chamber included in the reflow furnace according to the fourth embodiment.

Fourth Embodiment (FIGS. 11 and 12)

In this embodiment, a buffer chamber is provided at the inlet opening and/or outlet opening of the reflow furnace 1. More particularly, an inlet-side buffer chamber FB is provided upstream of the aforementioned first chamber R1 and an outlet-side buffer chamber RB is provided downstream of the fifth chamber R5. The buffer chambers FB and RB in this embodiment are provided to prevent gaseous nitrogen from leaking the nitrogen reflow furnace. In any of the buffer chambers FB and RB, there is not provided the atmosphere circulating mechanism 10 provided in each of the first to fifth chambers R1 to R5 to blow out and circulate the atmosphere.

Of the reflow furnace as the fourth embodiment of the present invention, the portion near the partition walls 2 in each of the first to fourth chambers R1 to R4 forming the heating zone is constructed as having been described above with reference to FIGS. 1 to 4, and the portion near the partition wall 2 between the fourth chamber R4 and the fifth chamber R5 as the cooling zone is constructed as having been described above with reference to FIG. 8. In the region near the partition wall 2 between the first chamber R1 and inlet-side buffer chamber FB, the distance between the lower end, namely, blowout end, of the hot air blowout pipes 20 and the printed circuit board 4 having the electronic components thereon is gradually longer in a direction toward the partition wall 2, as shown in FIG. 12. That is, in the region near the partition wall 2 between the first chamber R1 and inlet-side buffer chamber FB, the blowout end of the blowout pipes 20 is more distant from the support surface of the conveyor 5 to decrease the force of the vertical blow applied to the circuit board 4. In other words, in the region near the partition wall 2 between the first chamber R1 and inlet-side buffer chamber FB, the hot air blowout pipes 20 are gradually smaller in length in a direction toward the partition wall 2. It should be noted that the partition wall 2 between the first chamber R1 as the heating zone and the inlet-side buffer chamber FB is made of a thick heat-insulating wall formed from metallic plates such as steel sheet and a heat-insulative material provided between the metallic plates to extend to the bottom end of the partition wall 2.

Note that the velocity of the horizontal blow may not necessarily be reduced since the horizontal blow will not displace the electronic components 4b because the solder on the printed circuit board 4a starts being resolidified near the partition wall 2 between the fifth chamber R5 as the cooling zone and the inlet-side buffer chamber RB. However, the partition wall 2 may of course be designed similarly to the partition wall 2 between the first chamber R1 and inlet-side buffer chamber FB so that the horizontal blow will gradually be weaker in a direction toward the outlet-side buffer chamber RB.

The reflow furnace 1 including the buffer chambers FB and RB may of course be configured to limit the flow rate of atmosphere blown out from the blowout pipes 20 near the partition wall 2 as in the third embodiment (see FIG. 9).

Figure 13:
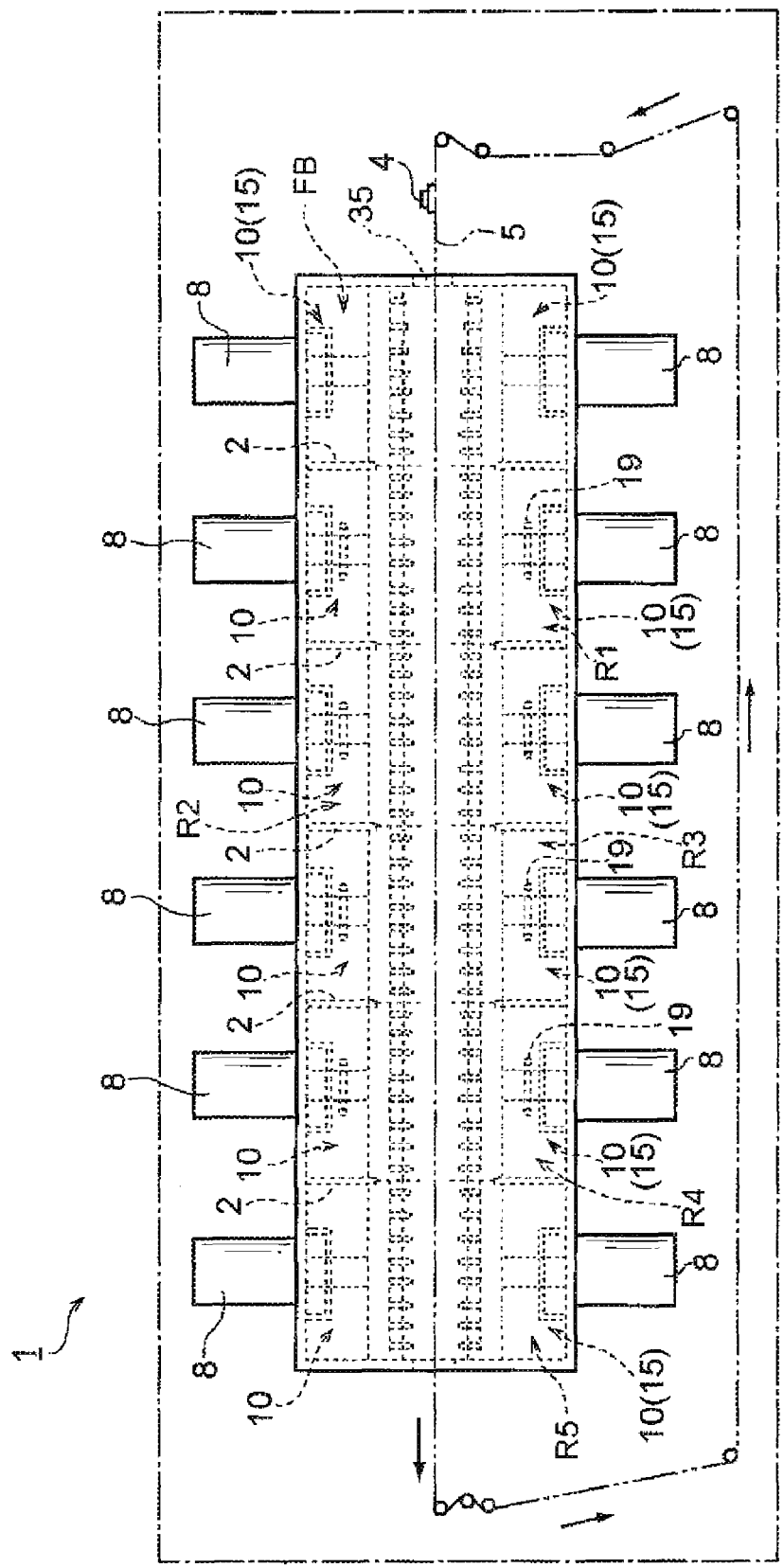
FIG. 13 is a diagram schematically illustrating a reflow furnace according to the fifth embodiment of the present invention.
Figure 14:
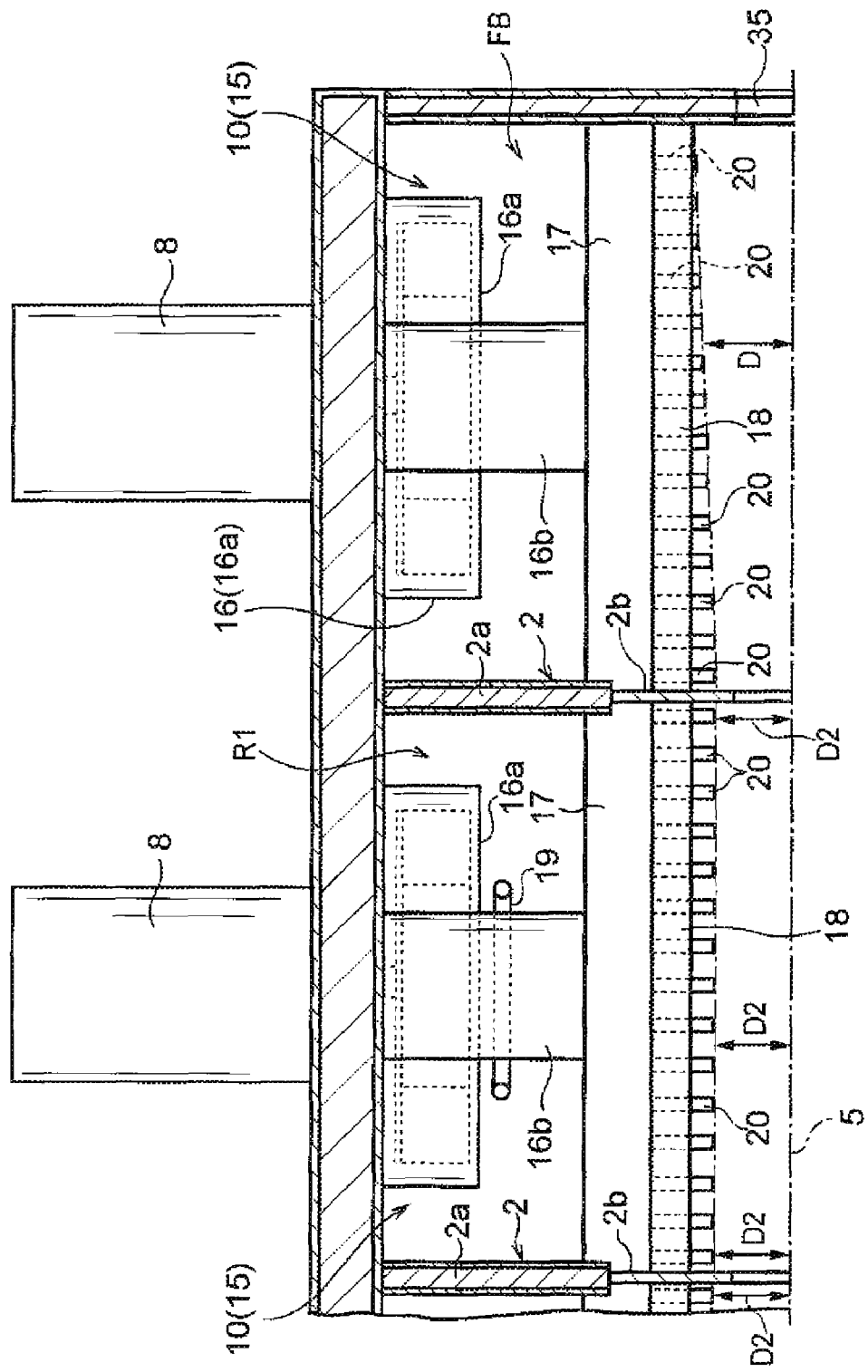
FIG. 14 is a diagram for explaining an inlet-side buffer chamber and a first chamber adjacent to the buffer chamber, both in the reflow furnace according to the fifth embodiment.
Figure 15:
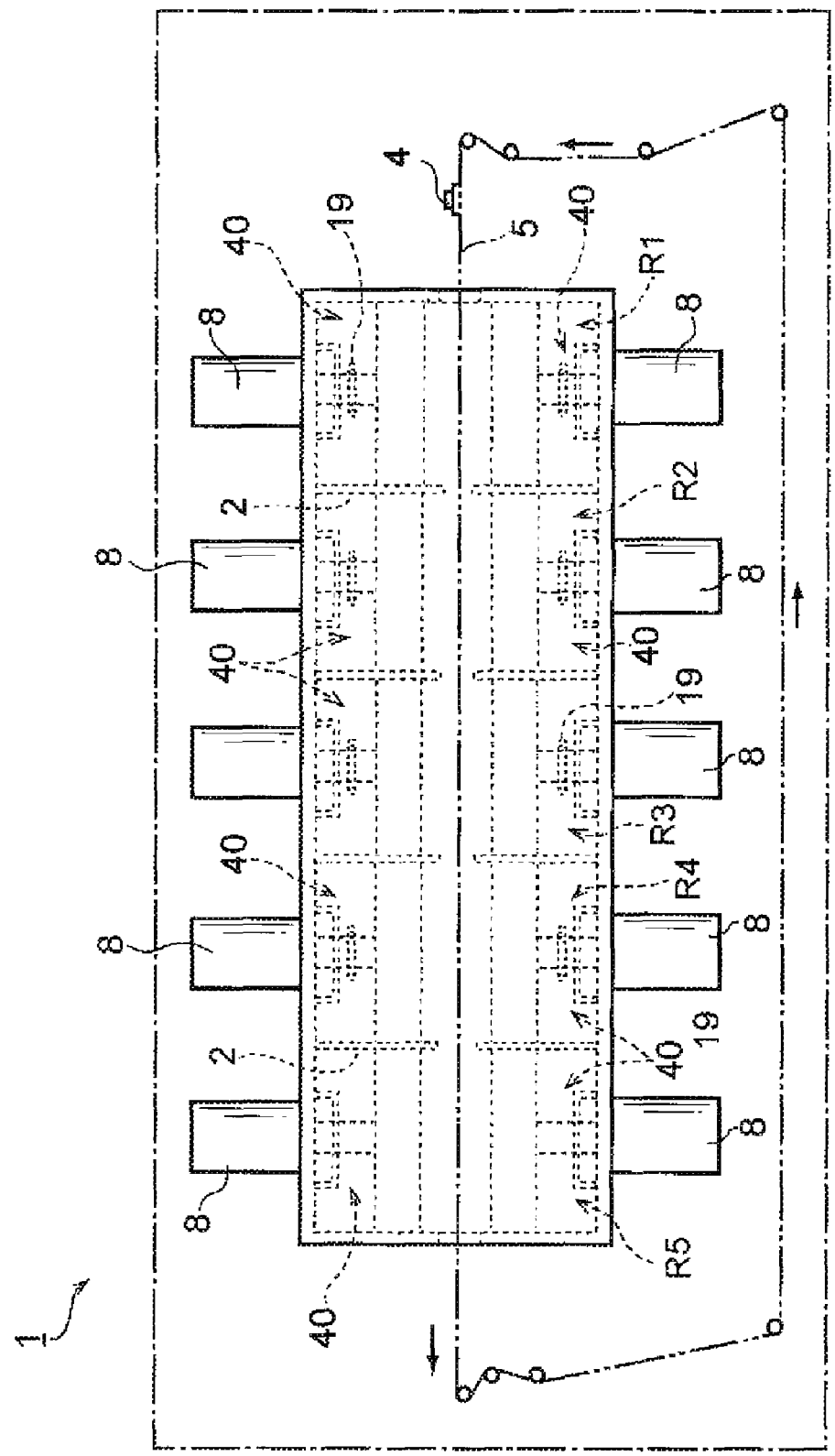
FIG. 15 is a diagram schematically illustrating a reflow furnace according to the sixth embodiment of the present invention.
Figure 16:
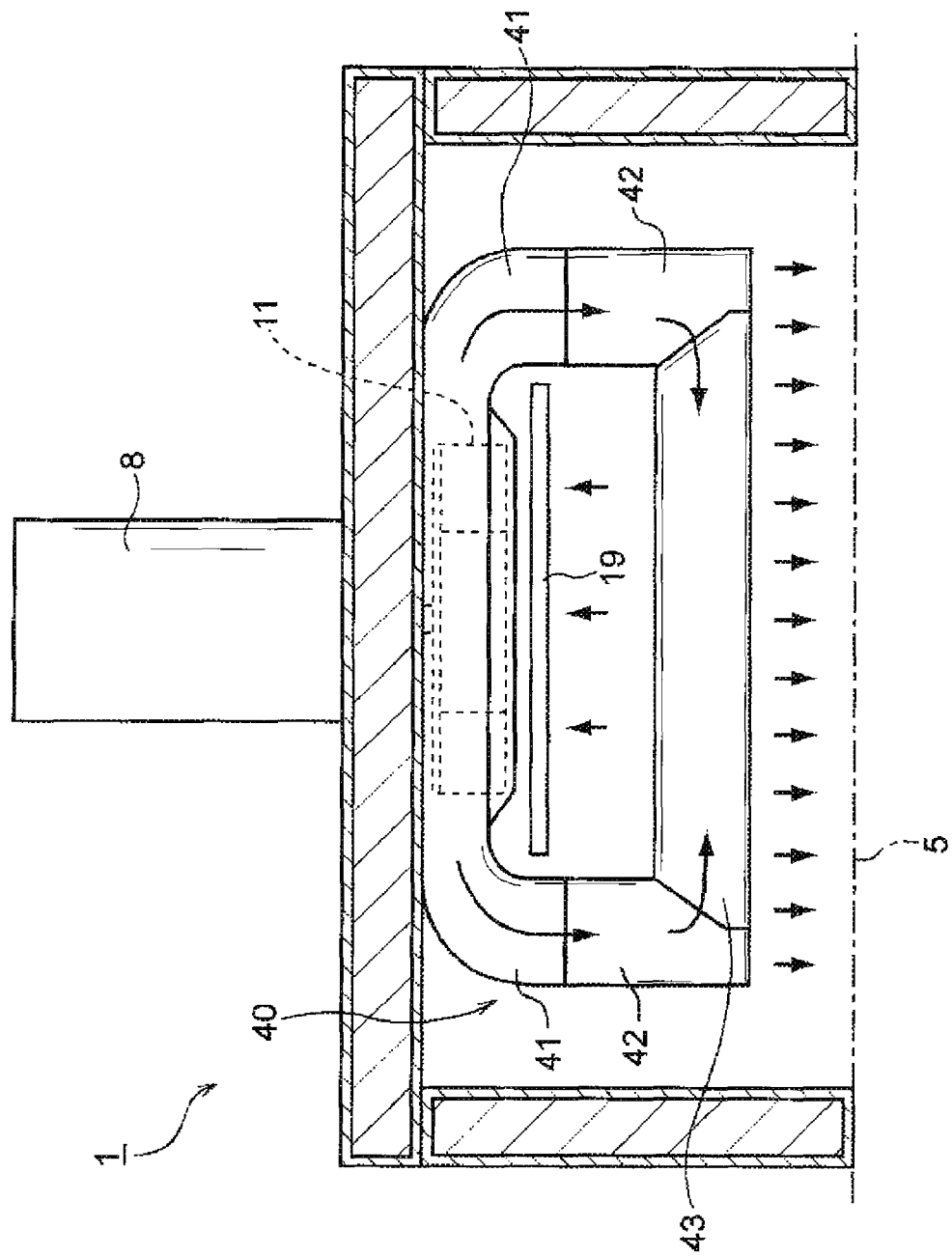
FIG. 16 is a cross-sectional view of the upper portion of the same reflow furnace, taken along the direction normal to the transport direction of the circuit board.
Figure 17:
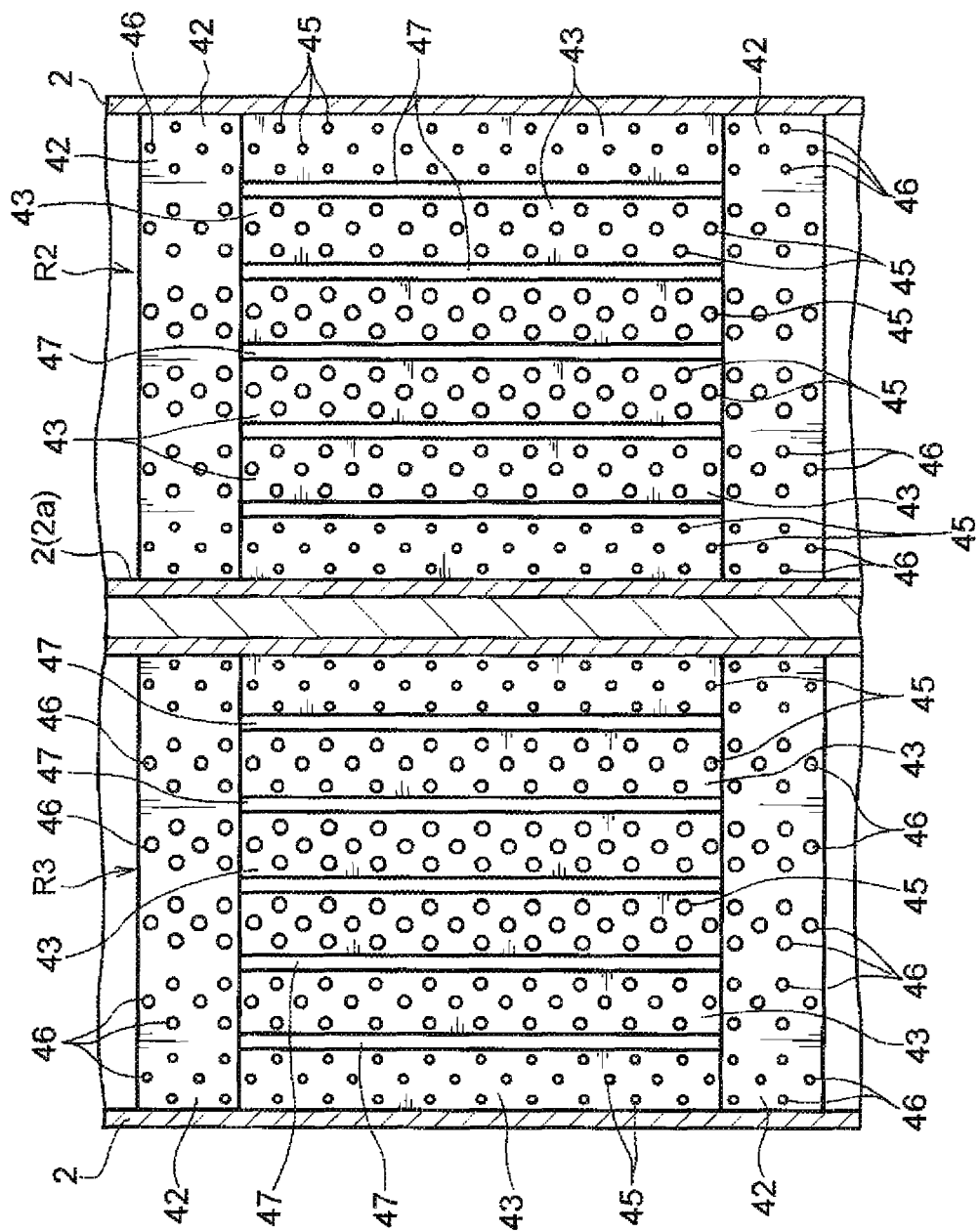
FIG. 17 is a diagram for explaining the upper portion of the reflow furnace according to the sixth embodiment of the present invention shown in FIG. 16, especially its atmosphere blowout holes and recovery holes.
Figure 18:
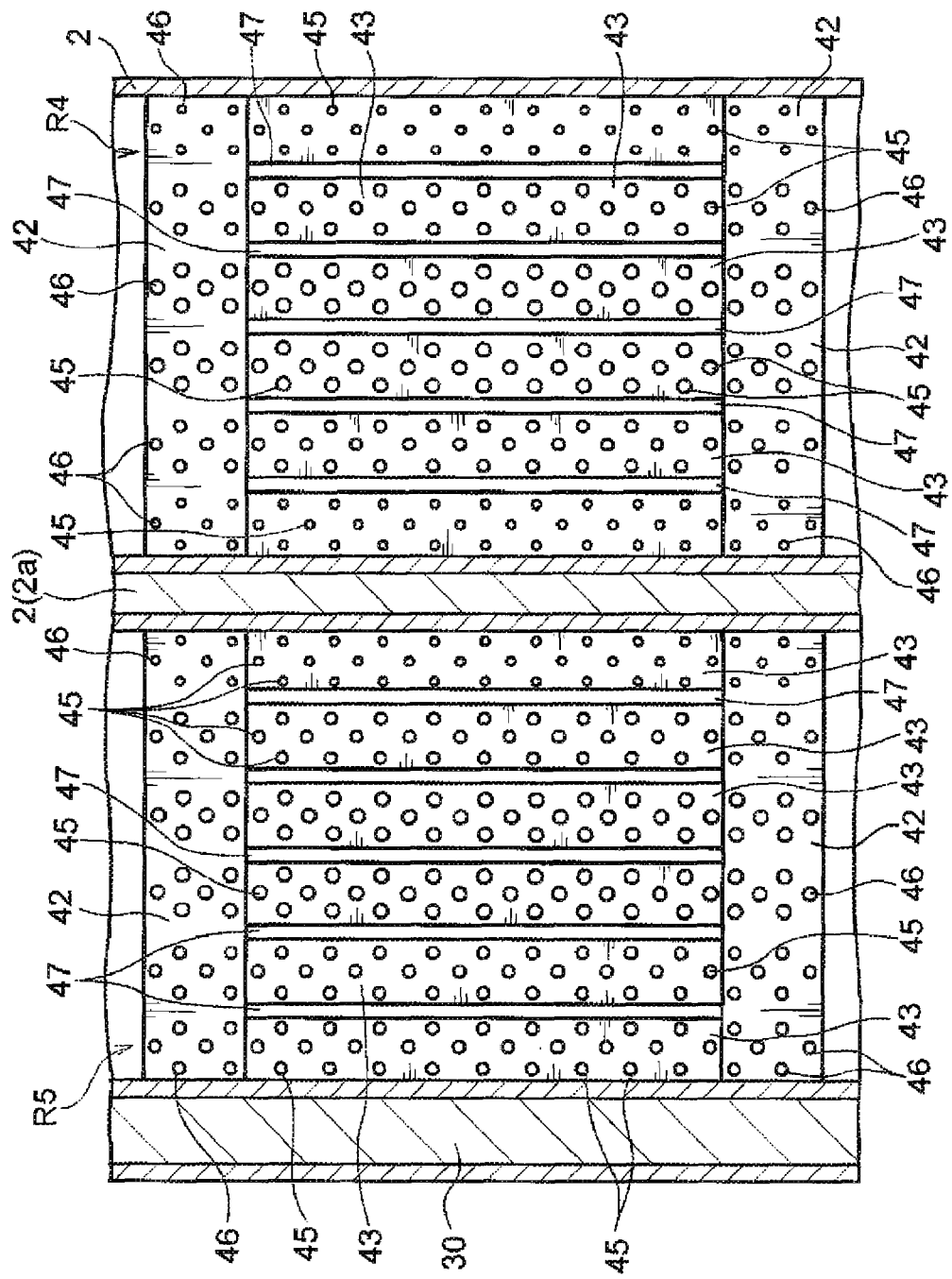
FIG. 18 is a diagram for explaining the upper portion of the reflow furnace according to the sixth embodiment shown in FIG. 16, especially the fifth chamber as a cooling zone as well as the atmosphere blowout holes and recovery holes in the fourth chamber as a heating zone.
Figure 19:
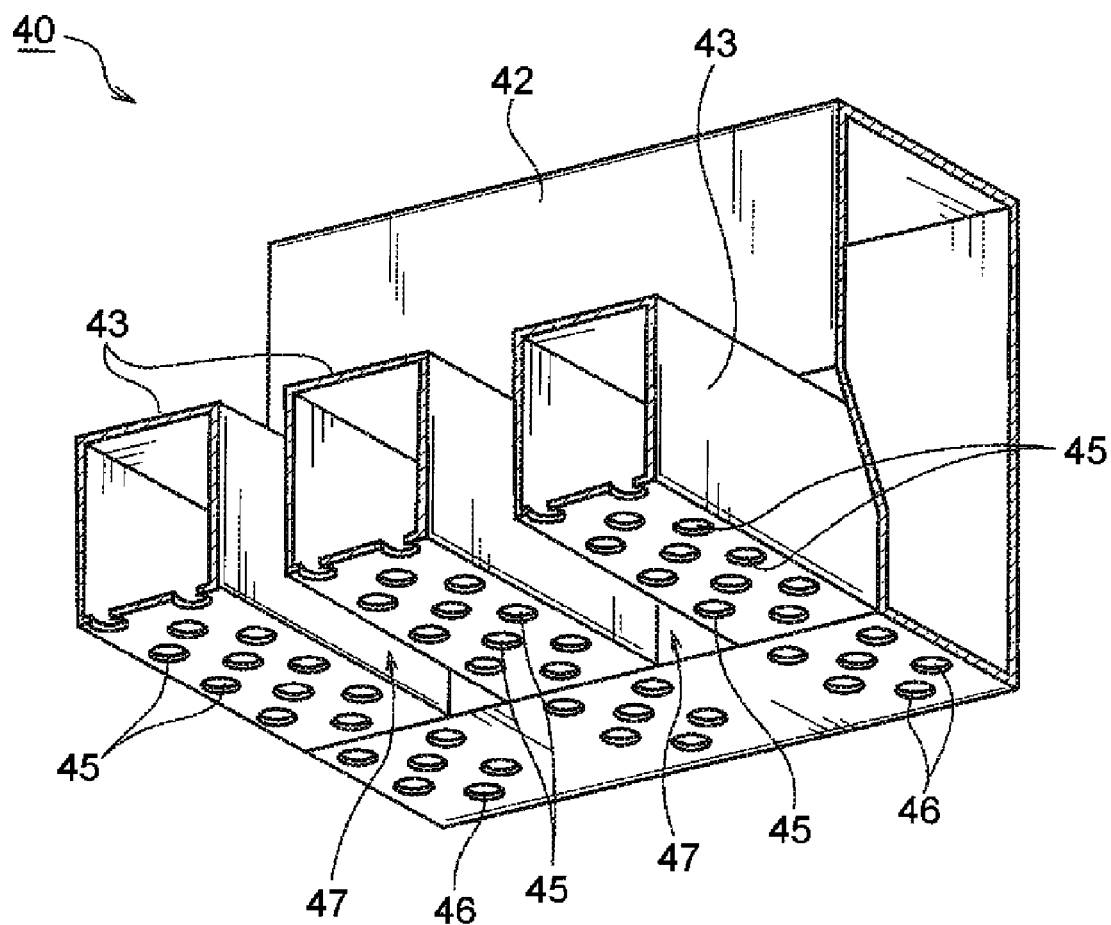
FIG. 19 is a diagram showing concrete configurations of the atmosphere blowout holes and recovery holes shown in FIGS. 17 and 18.
Figure 20:
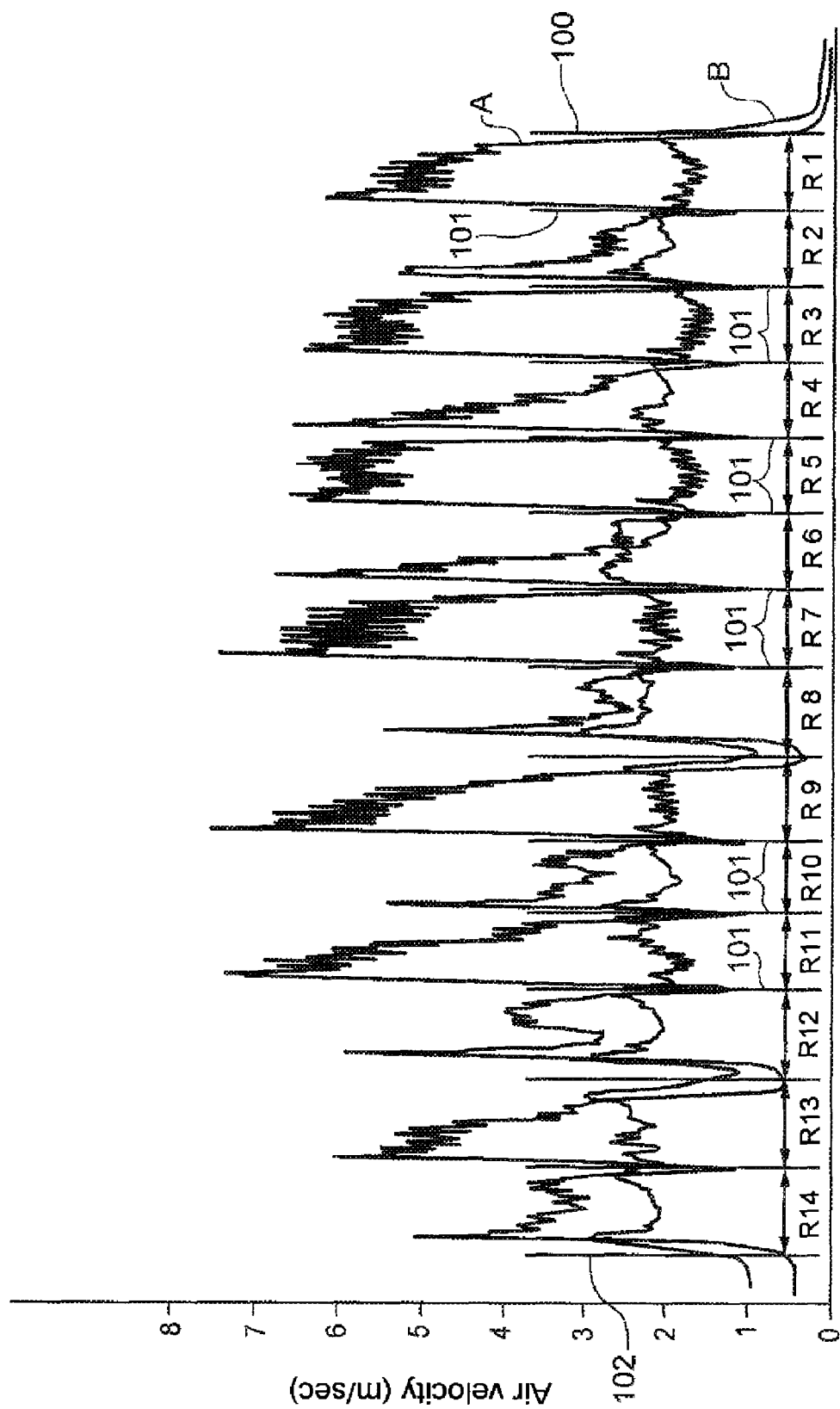
FIG. 20 is a diagram showing curves drawn by plotting measured values of vertical and horizontal blows of atmosphere in an existing reflow furnace, in which "A" indicates the vertical blow and "B" indicates the horizontal blow.
Figure 21A:
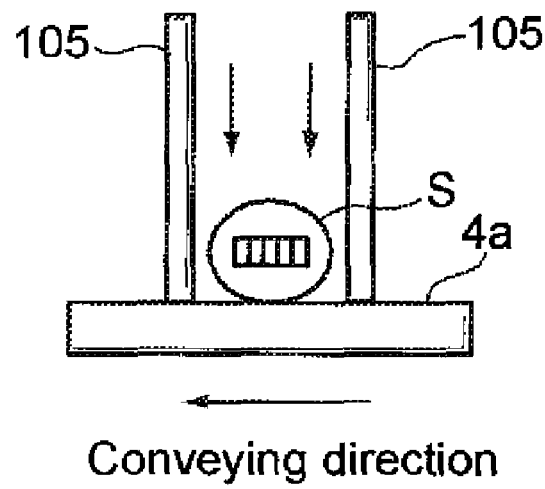
Figure 21B:
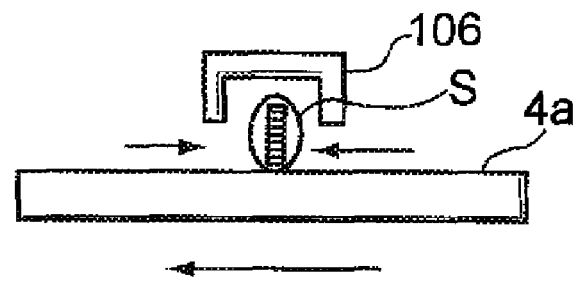

Fifth Embodiment (FIGS. 13 and 14)

The fifth embodiment is an example in which the inlet-side buffer chamber FB is provided upstream of the first chamber R1 forming the heating zone and the atmosphere circulating mechanism 10 is provided in the inlet-side buffer chamber FB. Of the blowout pipes 20 included in the atmosphere circulating mechanism 10 provided in the inlet-side buffer chamber FB, one adjacent to an inlet 35 of the inlet-side buffer chamber FB is shortest, and the other is gradually longer in a direction from the inlet 35 toward the partition wall 2 between the chamber FB and first chamber R1. Of course, a plurality of blowout pipes 20 different in length from each other may be prepared to locate the shortest one of them at the side of the inlet 35 of the inlet-side buffer chamber FB, the longest one adjacent to the partition wall 2 nearer to the first chamber R1 and a middle-length one in the region between the inlet 35 and partition wall 2, such that the blowout pipes 20 will gradually change in length in a direction from the inlet 35 toward the partition wall 2.

More specifically, in the design of the fifth embodiment, short blowout pipes 20 are used in one side nearer to the inlet 35 of the inlet-side buffer chamber FB to increase the distance D from the blowout ends of the blowout pipes 20 to the platform surface of the conveyor 5, and the distance D gradually decreases toward the partition wall 2 between the inlet-side buffer chamber FB and the first chamber R1. Of course, the distance D may be decreased gradually or stepwise down to the middle of the circuit board transport path in the inlet-side buffer chamber FB, and the shortest distance D2 may be kept unchanged in a range from the middle of the inlet-side buffer chamber FB to the partition wall 2 between the inlet-side buffer chamber FB and first chamber R1. By attenuating the vertical blow applied to the printed circuit board 4 near the inlet 35 of the inlet-side buffer chamber FB, the velocity of the horizontal blow can be decreased. Thus, it is possible to decrease the horizontal blow applied to the electronic components 4b on the circuit board 4a when the circuit board 4a enters the inlet-side buffer chamber FB and prevent the electronic components 4b on the circuit board 4a from being displaced.

Also, the amount of atmosphere, namely, inert gas, flowing out of the reflow furnace 1 from the inlet 35 of the inlet-side buffer chamber FB can be decreased, whereby the reflow furnace 1 can be operated with reduced costs.

According to the fifth embodiment, the features of the aforementioned first to fourth embodiments may be incorporated in the first to fifth chambers R1 to R5 in various manners. For example, the inner diameter of the blowout pipes 20 included in the air circulating mechanism 10 of the inlet-side buffer chamber FB may be varied. For example, the inner diameter of the blowout pipe 20 adjacent to the inlet 35 of the inlet-side buffer chamber FB may be set smallest while the inner diameter of the blowout pipes 20 be gradually larger in a direction from the inlet 35 toward the partition wall 2 between the inlet-side buffer chamber FB and first chamber R1.

Note that in the fifth embodiment, an outlet-side buffer chamber RB constructed substantially same as the aforementioned inlet-side buffer chamber FB may of course provided downstream of the fifth chamber R5 forming the cooling zone.

In the fifth embodiment, the partition wall 2 between the first chamber R1 and inlet-side buffer chamber FB includes an upper portion made of a heat-insulating wall 2a consisting of metallic plates such as steel sheet and an insulative material interposed between the metallic plates, and a lower portion formed from only a metallic-plate wall 2b made of a metallic plate, such as steel sheet, of 0.8 mm in thickness, for example. Of course, the metallic-plate wall 2b of the partition wall 2 may also be formed from the heat-insulative wall 2a.

Note that although in the above fifth embodiment, the velocity of the air in the inlet-side buffer chamber FB is adjusted by varying the length of the blowout pipes, the adjustment may be done by varying the inner diameter of the blowout pipes 20 as having been explained above with reference to FIGS. 9 and 10 (showing the third embodiment).

Sixth Embodiment (FIGS. 15 to 19)

In the aforementioned first to fifth embodiments, the atmosphere is blown to the printed circuit board 4 through the blowout pipes 20, the atmosphere is recovered through the circular holes 21, for example, formed between the adjacent blowout pipes 20, and circulated in each of the chambers R1 to R5. However, the present invention is not limited to these embodiments but can also be carried out as a sixth embodiment which will be illustrated and described below.

As shown in FIGS. 15 to 19, the reflow furnace as the sixth embodiment includes an atmosphere circulating mechanism 40 has a first guide member 41 including a blower housing in which the blower 11 is provided and air guides extending downward from the right and left, respectively, of the blower housing and communicating with a pair of second guide members 42.

Each of the second guide members 42 is a closed box having a rectangular section. The second guide members 42 are disposed apart from each other in the width direction of the conveyor 5, and each extends in the lengthwise direction of the conveyor 5. The second guide members 42 have connected between them a plurality of atmosphere blowout cylinders 43 each having a rectangular section and extending across the conveyor 5. These atmosphere blowout cylinders 43 are laid separately from each other in a common horizontal plane in the transport direction of the conveyor 5. Each of the atmosphere blowout cylinders 43 has formed in the bottom thereof many atmosphere-blowout circular holes 45 arranged equidistantly from each other in a staggered pattern. Also, each of the second guide members 42 has second blowout holes 46 formed in the horizontal bottom thereof.

The slit-like elongated clearance between the adjacent atmosphere blowout cylinders 43 forms an atmosphere recovery opening 47. The partition wall 2 is formed from a thick heat-insulating wall including metallic plates such as steel sheet and a heat-insulative material interposed between the metallic plates. The atmosphere blowout holes 45 in the atmosphere blowout cylinder 43 nearest to the partition wall 2 are smallest in diameter, and those formed in the atmosphere blowout cylinders 43 farther from the partition wall 2 are larger in diameter. That is, the atmosphere blowout holes 45 formed in the third, second and first atmosphere blowout cylinders 43, respectively, counted from the partition wall 2 are smaller in the order of these cylinders 43. It should be noted that in this embodiment, second atmosphere blowout holes 46 formed in the bottom of the second guide member 42 as well are smallest in the region adjacent to the partition wall 2 and larger in a direction away from the partition wall 2.

Therefore, in each of the first to fourth chambers R1 to R4 as the heating zone, the atmosphere heated to a predetermined temperature is supplied by the blower 11 from the first guide member 41 to the second guide members 42, and then from the second guide member 42 to the atmosphere blowout cylinders 43. The hot atmosphere is distributed by the atmosphere blowout cylinders 43 to many atmosphere blowout holes 45 and blown out from these holes 45 vertically onto the printed circuit board 4 under transportation by the conveyor 5 and having the electronic components in position thereon. The atmosphere in each of the chambers R1 to R4 is recovered via the slit-shaped atmosphere recovery holes 47 laid equidistantly from each other across and along the transport path, and sucked into the suction opening of the blower 11 while being passed through the heater 19 and thus heated. Similarly, in the fifth chamber R5 as the cooling zone, unheated atmosphere is supplied by the blower 11 from the first guide member 41 to the second guide members 42, and then from the second guide members 42 to the atmosphere blowout cylinders 43. The atmosphere is blown from the atmosphere blowout holes 45 in the atmosphere blowout cylinders 43 onto the printed circuit board 4 under transport by the conveyor 5 and having the electronic components thereon to cool the circuit board 4. Then, the atmosphere in the cooling chamber R5 is recovered through the atmosphere recovery holes 47, and sucked into the suction opening of the blower 11.

As explained above, the atmosphere blowout holes 45 in the atmosphere blowout cylinders 43, which extend across the transport path and disposed at equal intervals along the transport path, are formed to be small in diameter in the region adjacent to the partition wall 2 to limit the flow rate of the vertical blow in the region near the partition wall 2 in order to attenuate the horizontal blow near the partition wall 2. Thus, it is possible to reduce the velocity of the horizontal blow applied laterally to the electronic components 4b on the printed circuit board 4a when moved to pass by the partition wall 2 and hence to prevent the electronic components 4b from being offset from their proper positions when the circuit board 4a passes by the partition wall 2.

The above explanation is applicable also when the printed circuit board 4 having the electronic components 4b thereon moves from a heating zone into a cooling zone. Here again, the electronic components 4b on the circuit board 4a can be prevented from undesirable positional displacement.

As a variant of the sixth embodiment, the atmosphere may be blown through the atmosphere blowout cylinders 43 extending across the transport direction of the printed circuit board 4 and positioned at intervals in the transport direction of the circuit board 4. In this case, the flow rate of the atmosphere supplied to the atmosphere blowout cylinder 43 adjacent to the partition wall 2 may be limited to reduce the flow rate of the atmosphere in the region adjacent to the partition wall 2.

Note that in many cases, the partition walls 2 of the chambers R1 to R4 as the heating zone are designed thick with provision of a mechanism for adjusting the width of the conveyor 5, for example. Also, the partition wall 2 between the preheating and heating zones where it is necessary to prevent temperature interference, partition wall 2 between the heating and cooling zones and the partition wall 2 between the first chamber R1 as the heating zone and the inlet-side buffer chamber FB are designed thick with a thick insulative material provided in each of them in many cases. In case the partition walls 2 are thus formed thick, there is a tendency for the pitch of the adjacent atmosphere blowout pipes across the partition wall 2 to be larger. In this case, designing the atmosphere blowout holes 45 near the partition wall 2 to have a smaller diameter as in the sixth embodiment (see FIGS. 15 to 19) is effective for preventing the electronic components from being displaced when the printed circuit board passes by the partition wall 2.

In case the partition wall 2 is formed from the heat-insulating wall portion 2a and metallic-plate wall portion 2b as having previously been described with reference to FIG. 4 and the chambers R1 to R5 or arbitrary chambers are separated by relatively thin walls at a level where the atmosphere blowout holes 45 are formed in the atmosphere blowout cylinders 43, it is of course that the pitch of the adjacent atmosphere blowout holes 45 across the metallic-plate wall portion 2b may be equal to that between the atmosphere blowout holes 45 adjacent to each other in the direction of transporting the printed circuit board and also the atmosphere blowout holes 45 be formed equal in diameter to each other. In this case, the atmosphere blowout holes 45 adjacent to the inlet and outlet openings, respectively, of the reflow furnace 1 should preferably be formed small in diameter to reduce the force of the atmosphere vertically blown onto the circuit board (vertical blow) near the inlet and outlet openings of the reflow furnace 1.

Heretofore explained is the reflow furnace 1 in which soldering is made using a hot atmosphere whose temperature is controlled. However, the present invention is not limited only to the above-described reflow furnace 1 but also applicable to a reflow furnace using a radiation heater such as infrared heater.

It should be understood by those skilled in the art that various modifications, combinations, sub-combinations and alterations may occur depending on design requirements and other factors insofar as they are within the scope of the appended claims or the equivalents thereof.

What is claimed is:

1. A reflow furnace in which a printed circuit board applied with solder cream and having electronic components put in position on the solder cream is heated to join the electronic components to the circuit board, comprising:

a plurality of chambers separated by dividing the inner space of the furnace by partition walls located at intervals in the transport direction of the circuit board; and a heated atmosphere circulating mechanism to blow an atmosphere vertically onto the circuit board through a plurality of blowout holes extending substantially from a first partition wall to a second partition wall and to circulate the atmosphere in the chanber, while the circuit board passes through the chamber, wherein the force of the atmosphere blown vertically onto the circuit board in a region adjacent said first and second partition walls of each chamber is smaller than that of the atmosphere blown vertically onto the circuit board in a central region of the chamber, located along the direction of transporting the circuit board.

2. The reflow furnace according to claim 1, wherein the force of the atmosphere blown vertically onto the printed circuit board in a region adjacent an inlet wall of a first one of the chambers, located at an inlet opening of the furnace, is smaller than that of the atmosphere blown vertically onto the printed circuit board in the central region of the first chamber, located along the direction of transporting the circuit board.

3. The reflow furnace according to claim 2, wherein the force of the atmosphere blown vertically to the printed circuit board in the region adjacent an outlet wall of a last one of the chambers, located at an outlet opening of the furnace is smaller than that of the atmosphere blown vertically onto the printed circuit board in the central region of the last chamber, located along the direction of transporting the circuit board.

4. The reflow furnace according to claim 1, wherein the atmosphere circulating mechanism includes a blower and said plurality of blowout holes to distribute the atmosphere blown out from the blower and blow it vertically onto the printed circuit board, and wherein the effective area of the blowout holes formed in the region with adjacent said first and second partition walls of each chamber is smaller than that of the blowout holes formed in the central region of the chambers, located along the direction of transporting the circuit board.

5. The reflow furnace according to claim 4, wherein the blowout holes become smaller in effective area from ones in the central region of the chamber toward ones in a region adjacent said first and second partition walls in the direction of transporting the circuit board.

6. The reflow furnace according to claim 1, wherein the atmosphere circulating mechanism includes a blower and said plurality of blowout holes to distribute the atmosphere blown out from the blower and blow it vertically to the printed circuit board, and wherein the distance between the blowout holes in the region adjacent said first and second partition walls of each chamber and the circuit board is longer than that between the blowout holes in the central region of the chamber, located along the direction of transporting the circuit board, and the circuit board.

7. The reflow furnace according to claim 1, wherein the smaller force of the atmosphere blown vertically onto the circuit board in the regions at opposite sides of said first and second partition walls between neighboring chambers reduces a difference between horizontal airflows produced in said regions by the vertical airflows and hitting the circuit board under transportation from one chamber to the next chamber.

8. The reflow furnace according to claim 1, further comprising a heater for heating the atmosphere before vertically blown onto the circuit board passing through the chamber.

* * * * *

UNITED STATES PATENT AND TRADEMARK OFFICE
CERTIFICATE OF CORRECTION

PATENT NO. : 7,735,708 B2
APPLICATION NO. : 11/778842
DATED : June 15, 2010
INVENTOR(S) : Yamada Page 1 of 1

It is certified that error appears in the above-identified patent and that said Letters Patent is hereby corrected as shown below:

Column 16, Claim 1, line 46, "chanber" should read --chamber--

Column 17, Claim 4, line 6, "with" should be deleted

Column 18, Claim 7, line 11, "airfiows" should read --airflows--

Column 18, Claim 7, line 12, "airfiows" should read --airflows--

Signed and Sealed this
Twenty-first Day of June, 2011

David J. Kappos
*Director of the United States Patent and Trademark Office*